(12) United States Patent
Kao et al.

(10) Patent No.: US 11,848,209 B2
(45) Date of Patent: Dec. 19, 2023

(54) PATTERNING SEMICONDUCTOR DEVICES AND STRUCTURES RESULTING THEREFROM

(71) Applicant: Taiwan Semiconductor Manufacturing Co., Ltd., Hsinchu (TW)

(72) Inventors: Chun-Yu Kao, Hsinchu (TW); Sung-En Lin, Hsinchu (TW); Chia-Cheng Chao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 68 days.

(21) Appl. No.: 17/314,445

(22) Filed: May 7, 2021

(65) Prior Publication Data

US 2022/0277958 A1 Sep. 1, 2022

Related U.S. Application Data

(60) Provisional application No. 63/154,001, filed on Feb. 26, 2021.

(51) Int. Cl.
*H01L 21/033* (2006.01)
*H01L 21/308* (2006.01)

(52) U.S. Cl.
CPC ...... *H01L 21/0338* (2013.01); *H01L 21/3088* (2013.01)

(58) Field of Classification Search
CPC .................................................. H01L 21/3088
See application file for complete search history.

(56) References Cited

U.S. PATENT DOCUMENTS

| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |

(Continued)

FOREIGN PATENT DOCUMENTS

| DE | 102016123943 A | 5/2018 |
| DE | 102017127390 A1 | 1/2019 |

(Continued)

*Primary Examiner* — Walter H Swanson
(74) *Attorney, Agent, or Firm* — Slater Matsil, LLP

(57) ABSTRACT

A method includes depositing a first mask over a target layer; forming a first mandrel and a second mandrel over the first mask; forming first spacers on the first mandrel and second spacers on the second mandrel; and selectively removing the second spacers while masking the first spacers. Masking the first spacers comprising covering the first spacers with a second mask and a capping layer over the second mask, and the capping layer comprises carbon. The method further includes patterning the first mask and transferring a pattern of the first mask to the target layer. Patterning the first mask comprises masking the first mask with the second mandrel, the first mandrel, and the first spacers.

20 Claims, 27 Drawing Sheets

(56) References Cited

U.S. PATENT DOCUMENTS

| | | | |
|---|---|---|---|
| 9,620,380 B1 * | 4/2017 | Dai | H01L 21/3086 |
| 9,647,116 B1 | 5/2017 | Lee et al. | |
| 10,692,728 B2 | 6/2020 | Zhou et al. | |
| 10,861,746 B2 | 12/2020 | Jang et al. | |
| 2013/0001750 A1 | 1/2013 | Arnold et al. | |
| 2018/0294185 A1 | 10/2018 | Chen et al. | |
| 2019/0006174 A1 | 1/2019 | Huang et al. | |
| 2019/0123181 A1 | 4/2019 | Chen et al. | |
| 2019/0157094 A1 | 5/2019 | Lin et al. | |
| 2019/0237333 A1 | 8/2019 | Su | |
| 2019/0385915 A1 | 12/2019 | Park et al. | |
| 2020/0144070 A1 * | 5/2020 | Shih | H01L 21/0337 |
| 2020/0258754 A1 | 8/2020 | Lin et al. | |
| 2020/0343140 A1 | 10/2020 | Wang et al. | |
| 2021/0226036 A1 | 7/2021 | Ching et al. | |

FOREIGN PATENT DOCUMENTS

| | | |
|---|---|---|
| TW | 201715726 A | 5/2017 |
| TW | 201820483 A | 6/2018 |
| TW | 201838022 A | 10/2018 |
| TW | 201906008 A | 2/2019 |
| TW | 202034381 A | 9/2020 |
| TW | 202101546 A | 1/2021 |

\* cited by examiner

PATTERNING SEMICONDUCTOR DEVICES AND STRUCTURES RESULTING THEREFROM

PRIORITY

This application claims the benefit of U.S. Provisional Application No. 65/154,001, filed on Feb. 26, 2021, which application is hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
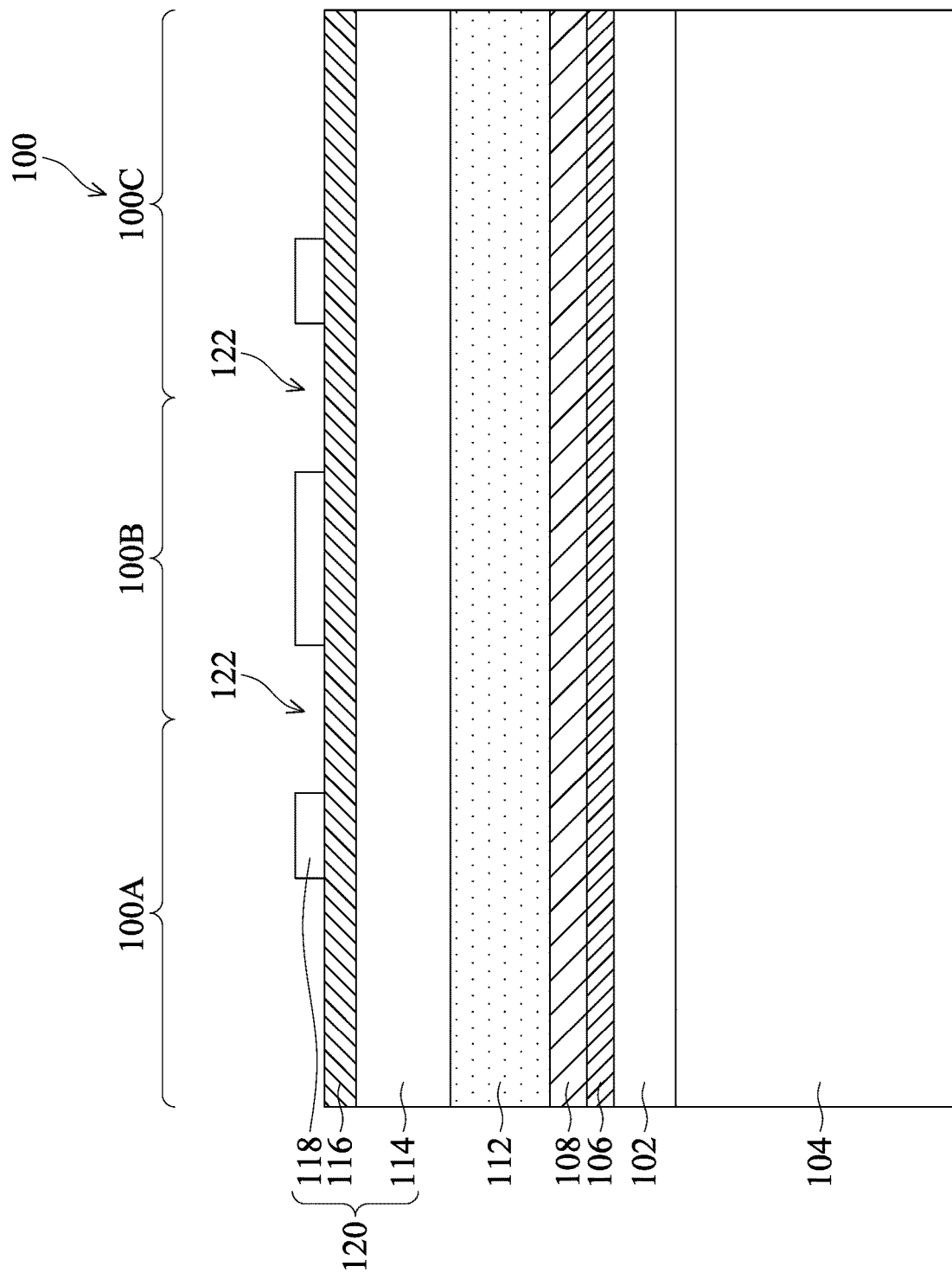
FIGS. 1, 2, 3, 4, 5, 6, 7, 8, 9, 10, 11, 12, 13, 14, 15, 16 17, 18, 19, and 20 illustrate cross-sectional and perspective views of various intermediary stages of manufacturing a semiconductor device according to various embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in respect to a specifically patterning process, namely a self-aligned double patterning (SADP) process where mandrels are patterned, spacers are formed along sidewalls of the mandrels, and at least a portion of the mandrels are removed leaving the spacers to define a pattern at half a pitch of the mandrels. However, various embodiments may be directed at other patterning processes, such as, self-aligned quadruple patterning (SAQP), and the like.

A semiconductor device and method are provided in accordance with some embodiments. In particular, a self-aligned double patterning process is performed to pattern features (e.g., semiconductor fins, gate structures, conductive lines, or the like) into a target layer of a semiconductor device. At least some of the patterned features have a pitch that is at least one half of a minimum pitch achievable using photolithographic processes. The patterned features may include features that are patterned using the above described mandrels, spacers, and/or a combination thereof. Specifically, different combinations of the mandrels and spacers may be used to pattern different areas of the target layer to achieve patterned features having different sizes and/or spacings.

The mandrels and spacers may be selectively removed from different regions over the target layer depending on a desired resulting feature size in the target layer. To achieve the selective removal, one or more masks may be deposited over the mandrels and spacers. In various embodiments, a carbon-rich layer may be deposited over the spacers (e.g., between different masks) to reduce etching damage (e.g., spacer material loss) as a result of the selective removal of the mandrels and/or the spacers. According, mandrels and spacers of a desired dimension can be precisely patterned, and critical dimension control while patterning the target layer can be improved.

FIGS. 1 through 19 illustrate cross-sectional views of intermediate stages in the formation of features in a target layer 104 of a semiconductor device 100, in accordance with some exemplary embodiments. The target layer 104 is a layer in which a plurality of patterns is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 104 is a semiconductor substrate. The semiconductor substrate may comprise silicon, doped or undoped, or an active layer of a semiconductor-on-insulator (SOI) substrate. The target layer 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs).

In some embodiments, the target layer 104 is a conductive layer, such as, a metal layer or a polysilicon layer, which is blanket deposited. Embodiment patterning processes may be applied to the target layer 104 in order to pattern semiconductor gates and/or dummy gates of finFETS. By using embodiment processes to pattern a conductive target layer 104, spacing between adjacent gates may be reduced and gate density may be increased. In such embodiments, the target layer 104 may be formed over a semiconductor substrate, e.g., as described above.

In some embodiments, the target layer 104 is an inter-metal dielectric (IMD) layer. In such embodiments, the target layer 104 comprises a low-k dielectric material having a dielectric constant (k value) lower than 3.8, lower than about 3.0, or lower than about 2.5, for example. In alternative embodiments, target layer 104 is an IMD layer comprising high-k dielectric material having a k value higher than 3.8. Openings may be patterned in the target layer 104 with the embodiment processes, and conductive lines and/or vias may be formed in the openings. In such embodiments, the target layer may be formed over a semiconductor substrate (e.g., as described above), and devices, such as transistors, diodes, capacitors, resistors, etc., may be formed in and/or on an active surface of semiconductor substrate.

The device 100 includes three regions 100A, 100B, and 100C. Different types of devices and/or devices of different geometries (e.g., sizes) may be formed in each of the three regions 100A, 100B, and 100C. For example, the region 100A may be processed to form features (e.g., semiconductor fins) of a first width in the target layer 104; the region 100B may be processed to form features of a second width in the target layer 104 that is greater than the first width; and the region 100C may be processed to form features of a third width in the target layer 104 that is greater than the first width but less than the second width. For example, the first width may be less than about 15 nm; the second width may be greater than about 15 nm to about 30 nm; and the third width may be in a range of about 15 nm to about 30 nm. In some embodiments, n-type devices may be formed in the regions 100A and 100C while p-type devices are formed in the region 100B. Other feature sizes and/or types of devices may be formed in different regions of the device 100 in other embodiments. Further although regions 100A, 100B, and 100C are illustrated as directly abutting each other, any number of intermediate features and/or spacing may be disposed between each of the regions 100A, 100B, and 100C.

An adhesion layer 102 is deposited over the target layer 104. The adhesion layer 102 may be deposited by physical vapor deposition (PVD), chemical vapor deposition (CVD), atomic layer deposition (ALD), or the like. In some embodiments, the adhesion layer 102 may function as adhesion layer and may function as an etch stop layer during subsequent fin formation. Although FIG. 1 illustrates adhesion layer 102 being in physical contact with target layer 104, any number of intervening layers may be disposed between adhesion layer 102 and target layer 104.

The film stack further includes a hard mask layer 106 formed over the adhesion layer 102. The hard mask layer 106 may be formed of a material that may be etched electively compared to the adhesion layer 102. For example, in embodiments where the adhesion layer 102 comprises an oxide, the hard mask layer 106 may be nitride, such as, silicon nitride, or the like. The hard mask layer 106 may be deposited, for example, by PVD, CVD, ALD, or the like. In some embodiments, the hard mask layer 106 may have a thickness in a range of about 200 Å to about 300 Å, for example.

The film stack further includes a hard mask 108 over the hard mask layer 106. In some embodiments, the hard mask 108 may comprise a material that can be selectively etched compared to the hard mask layer 106. For example, in embodiments where the hard mask layer 106 comprises a nitride, the multilayered hard mask 108 may comprise an oxide. Specifically, in some embodiments, the hard mask layer 108 comprises silicon oxide (e.g., $SiO_2$ or the like), silicon oxynitride (SiON), silicon oxycarbon nitride (SiOCN), combinations thereof, or the like. The hard mask layer 108 may be deposited, for example, by PVD, CVD, ALD, or the like.

The film stack further includes a mandrel layer 112 formed over the hard mask 108. The mandrel layer 112 may comprise silicon (e.g., amorphous silicon), or the like. The mandrel layer 112 may be deposited using any suitable process, such as, ALD, CVD, PVD, or the like.

A tri-layer photoresist 120 is formed on the film stack over the mandrel layer 112. The tri-layer photoresist 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which include organic materials. In some embodiments, the bottom layer 114 may also be a bottom anti-reflective coating (BARC) layer. The middle layer 116 may comprise an inorganic material, which may be a nitride (such as silicon nitride), an oxynitride (such as silicon oxynitride), an oxide (such as silicon oxide), or the like. The middle layer 116 has a high etching selectivity relative to the upper layer 118 and the bottom layer 114. The various layers of the tri-layer photoresist 120 may be blanket deposited sequentially using, for example, spin-on processes. Although a tri-layer photoresist 120 is discussed herein, in other embodiments, the photoresist 120 may be a monolayer or a bilayer (e.g., comprising only the bottom layer 114 and the upper layer 118 without the middle layer 116) photoresist. The type of photoresist used (e.g., monolayer, bilayer, or tri-layer) may depend on the photolithography process used to pattern the mandrel layer 112. For example, in advanced extreme ultraviolet (EUV) lithography processes, a monolayer or bilayer photoresist 120 may be used.

In some embodiments, the upper layer 118 is patterned using a photolithographic process. Subsequently, the upper layer 118 is used as an etching mask for patterning of the middle layer 116 (see FIG. 2). The middle layer 116 is then used as an etching mask for patterning of the bottom layer 114, and the bottom layer 114 is then used to pattern the mandrel layer 112 (see FIGS. 3 and 4). It has been observed that by using a tri-layer photoresist (e.g., tri-layer photoresist 120) to etch a target layer (e.g., mandrel layer 112), improved definition in fine-pitched patterns can be achieved in the target layer (e.g., mandrel layer 112).

The upper layer 118 is patterned using any suitable photolithography process to form openings 122 therein. As an example of patterning openings 122 in the upper layer 118, a photomask may be disposed over the upper layer 118. The upper layer 118 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the top photoresist layer may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used.

Figure 2:
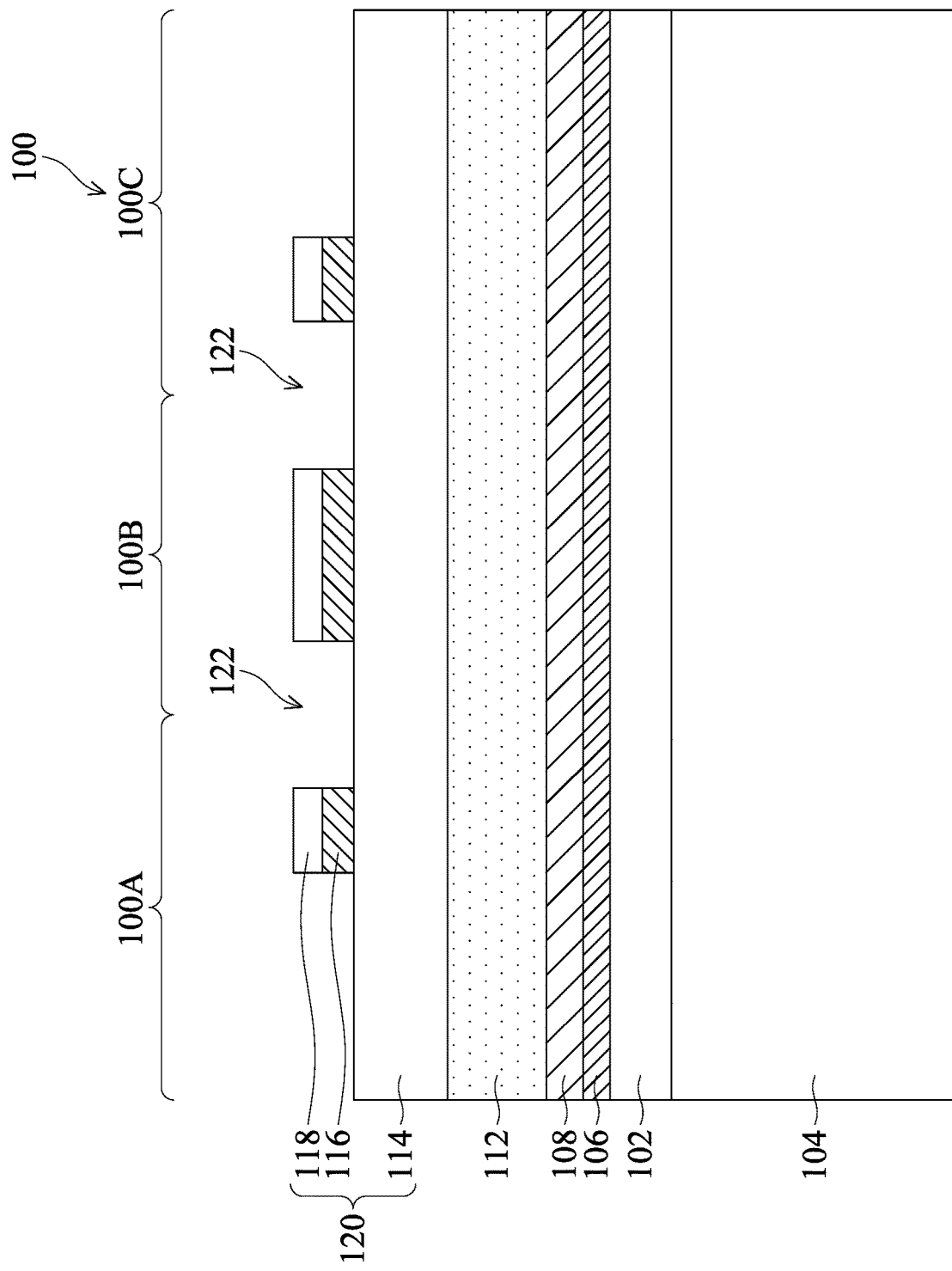

After the patterning of the upper layer 118, the pattern of the upper layer 118 is transferred to the middle layer 116 in an etching process. The etching process is anisotropic, so that the openings 122 in the upper layer 118 are extended through the middle layer 116 and have about the same sizes in the middle layer 116 as they do in the upper layer 118. The resulting structure is illustrated in FIG. 2.

Optionally, a trimming process may be performed to increase the size of the openings 122 in the middle layer 116. In an embodiment, the trimming process is an anisotropic plasma etch process with process gases including $O_2$, $CO_2$, $N_2/H_2$, $H_2$, the like, a combination thereof, or any other gases suitable for trimming the middle layer 116.

Figure 3:
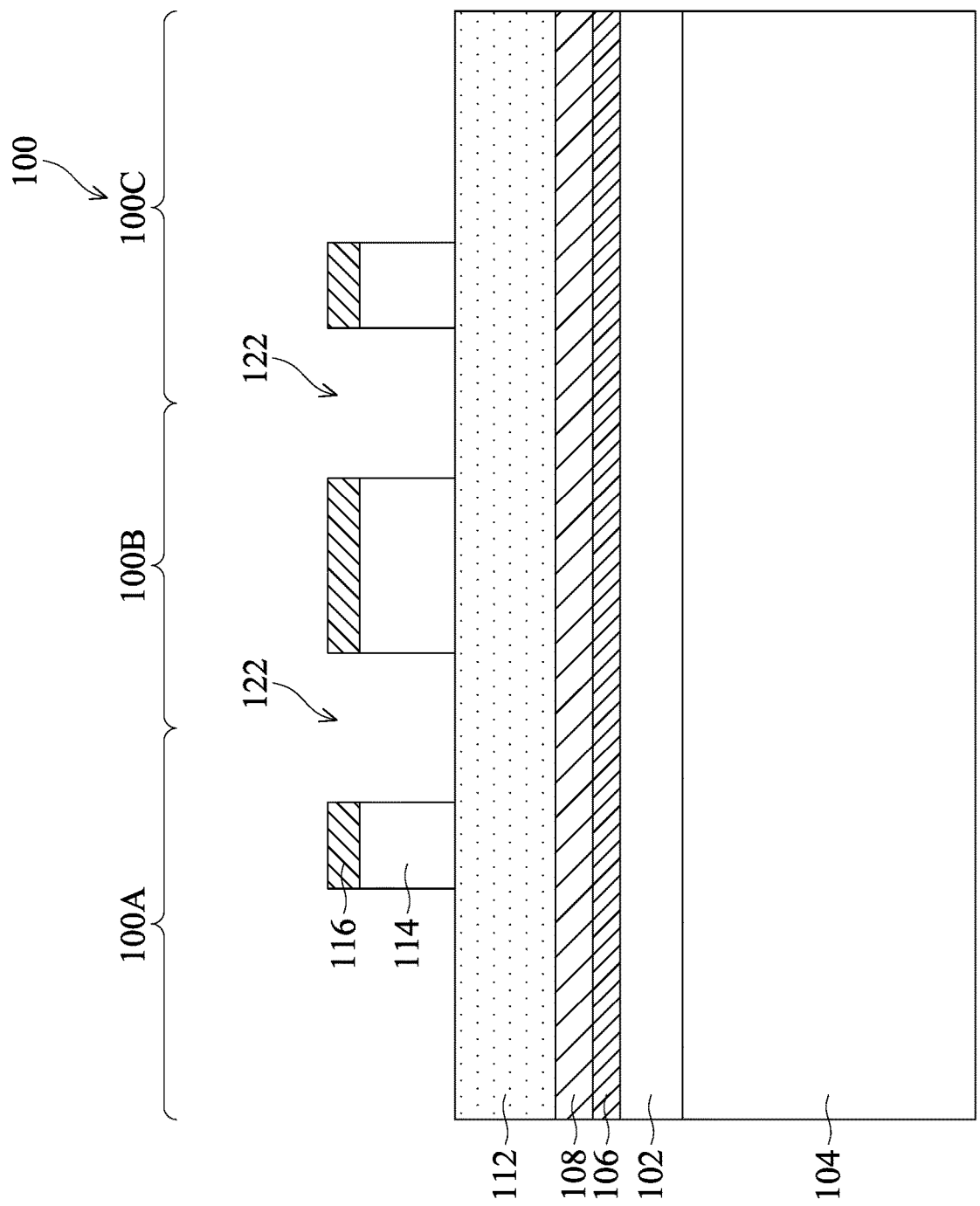

In FIG. 3, an etching process is performed to transfer the pattern of the middle layer 116 to the bottom layer 114, thereby extending the openings 122 through the bottom layer 114. The etching process of the bottom layer 114 is anisotropic, so that the openings 122 in the middle layer 116 are extended through the bottom layer 114 and have about the same sizes in the middle layer 116 as they do in the bottom layer 114. As part of etching the bottom layer 114, the upper layer 118 (see FIGS. 1 and 2) may be consumed.

Figure 4:
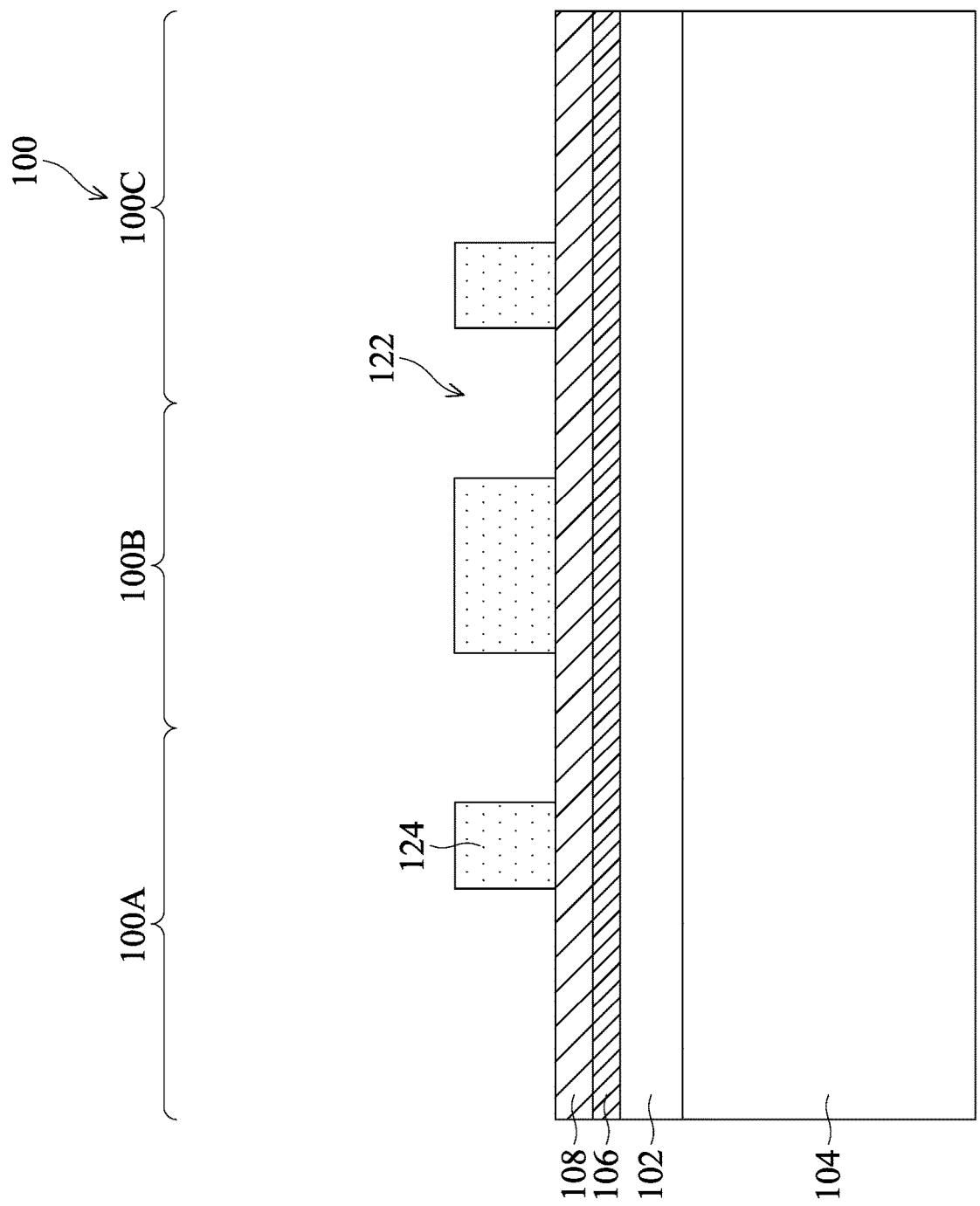

In FIG. 4, the pattern of the bottom layer 114 (see FIG. 3) is transferred to the mandrel layer 112 using an etching process. The etching process of the mandrel layer 112 is anisotropic, so that the openings 122 in the bottom layer 114 are extended through the mandrel layer 112. The openings 122 have about the same widths in the mandrel layer 112 as they do in the bottom layer 114. The etching may be a dry etch (e.g., a plasma etch), or the like.

A layer immediately underlying the mandrel layer 112 (e.g., the hard mask 108) may be used as an etch stop layer when patterning the mandrel layer 112. Specifically, the etching process may use an etchant that selectively etches the mandrel layer 112 without significantly etching the hard mask layer 108. For example, in embodiments where the mandrel layer 112 comprises silicon and the hard mask layer comprises silicon oxide, the etching process may use HBr, $CF_4$, $Cl_2$, $NF_3$, or the like, as an etchant.

Thus, mandrels 124 are defined from remaining portions of the mandrel layer 112 (e.g., portions of mandrel layer 112 between openings 122). As illustrated, the mandrels 124 may have varying sizes in each of the regions 100A, 100B, and 100C, which may correspond to a desired size and/or spacing of features that are subsequently patterned in the target layer 104. For example, the mandrels 124A and 124C in the regions 100A and 100C may be thinner than the mandrel 124B in the region 100B. In other embodiments, the mandrels 124 in each of the regions 100A, 100B, and 100C may have different relative dimensions. For example, the mandrel 124C in the region 100C may be wider than the mandrel 124A but thinner than the mandrel 124A in other embodiments. During etching the mandrel layer 112, the middle layer 116 is consumed, and bottom layer 114 may be at least partially consumed.

In embodiments when the bottom layer 114 is not completely consumed while etching the mandrel layer 112, an ashing process may be performed to remove remaining residue of the bottom layer 114. The ashing process may comprise an oxygen plasma strip, which exposes the mandrels 124 to oxygen plasma.

Figure 5:
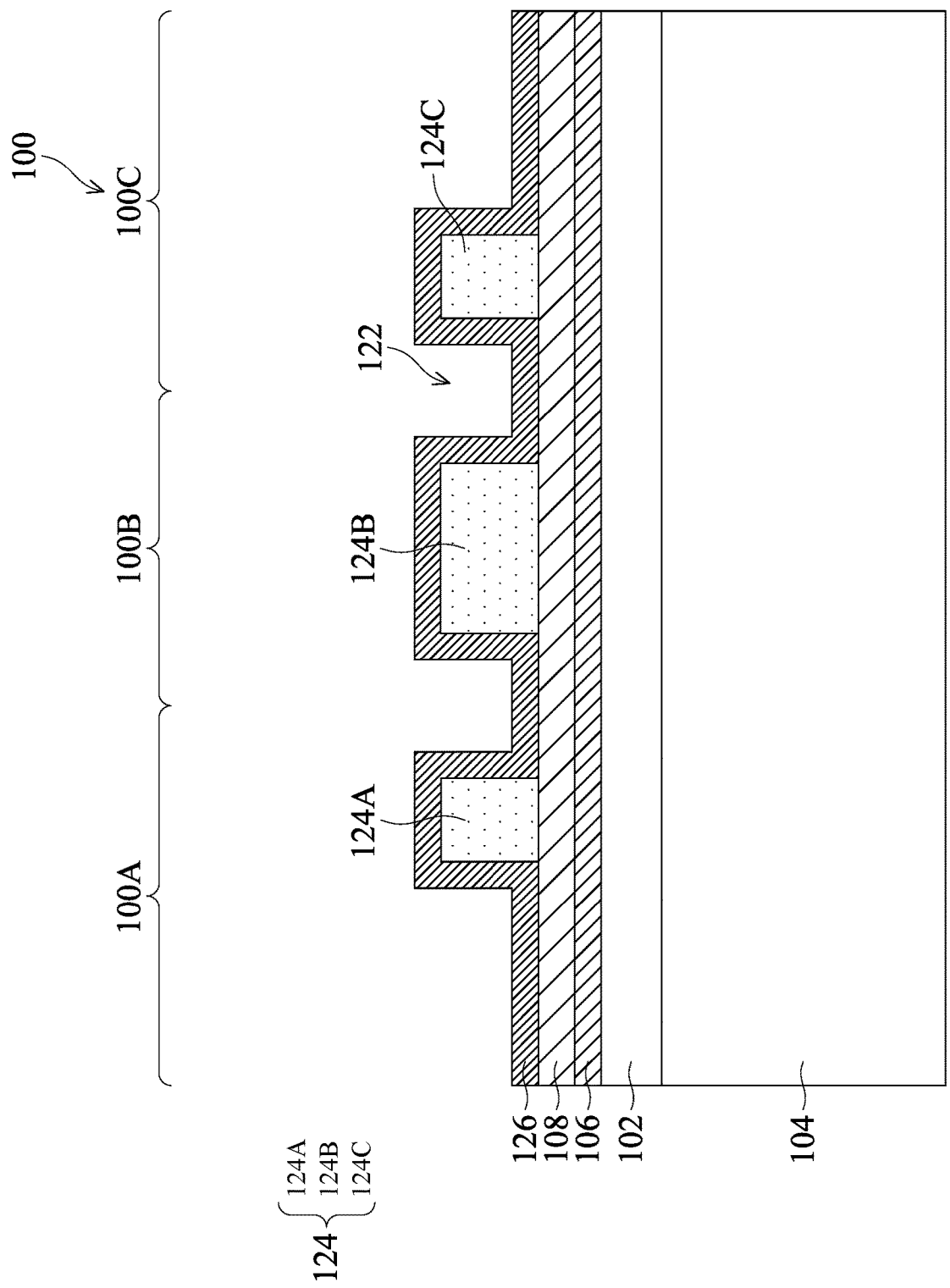

In FIG. 5, a spacer layer 126 is formed over and along sidewalls of the mandrels 124. The spacer layer 126 may further extend along top surfaces of the hard mask 108 in the openings 122. The material of the spacer layer 126 is selected to have a high etching selectivity with the hard mask layer 108 and the mandrels 124. For example, the spacer layer 126 may comprise SiN, SiCON, SiON, metals, metal alloys, and the like, and may be deposited using any suitable process such as ALD, CVD, or the like. In some embodiments, the deposition process of the spacer layer 126 is conformal so that a thickness of the spacer layer 126 on sidewalls of the mandrels 124 is substantially equal (e.g., within manufacturing tolerances) of a thickness of the spacer layer 126 on the top surface of mandrels 124 and bottom surfaces of the openings 122.

Figure 6:
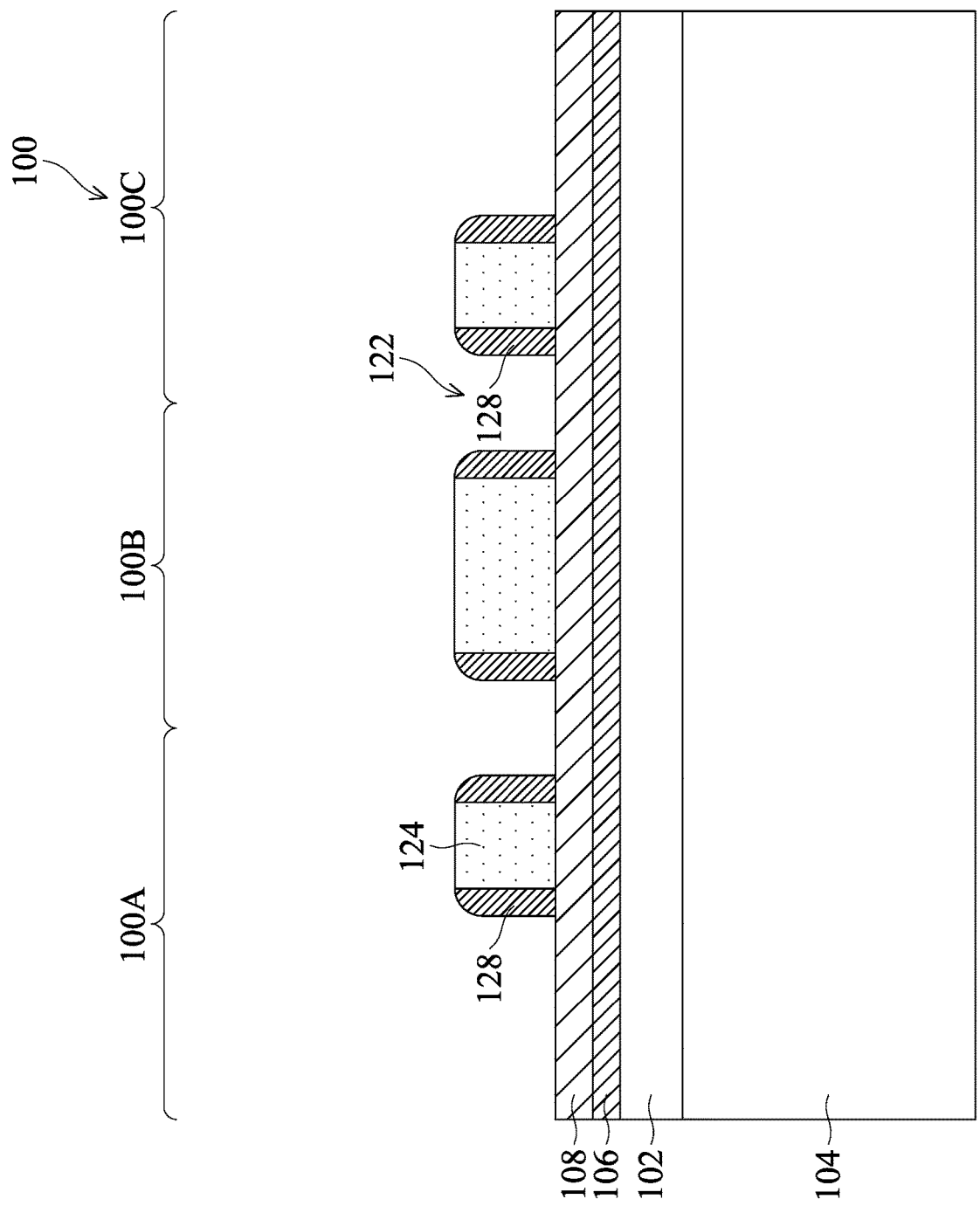

In FIG. 6, the spacer layer 126 is patterned to remove lateral portions of the spacer layer 126 while leaving spacers 128 on sidewalls of the mandrels 124. Etching the spacer layer 126 exposes the mandrels 124 and portions of the layer underlying the mandrels 124 (e.g., the hard mask 108). Patterning the spacer layer 126 may include a dry etch process, which selectively etches the spacer layer 126 at a higher rate than the mandrels 124. Example etchants for etching the spacer layer 126 may include a fluorine reactive gas, such as, $CF_4$, $NF_3$, HCl, HBr, or the like. Other process gases may be used in combination with the etchants, such as, oxygen ($O_2$), nitrogen ($N_2$), argon (Ar), combinations thereof, or the like. The dry etch process may be anisotropic and etch exposed, lateral portions of the spacer layer 126 while leaving vertical portions of the spacer layer 126 (the spacers 128) on the mandrels 124.

Figure 7:
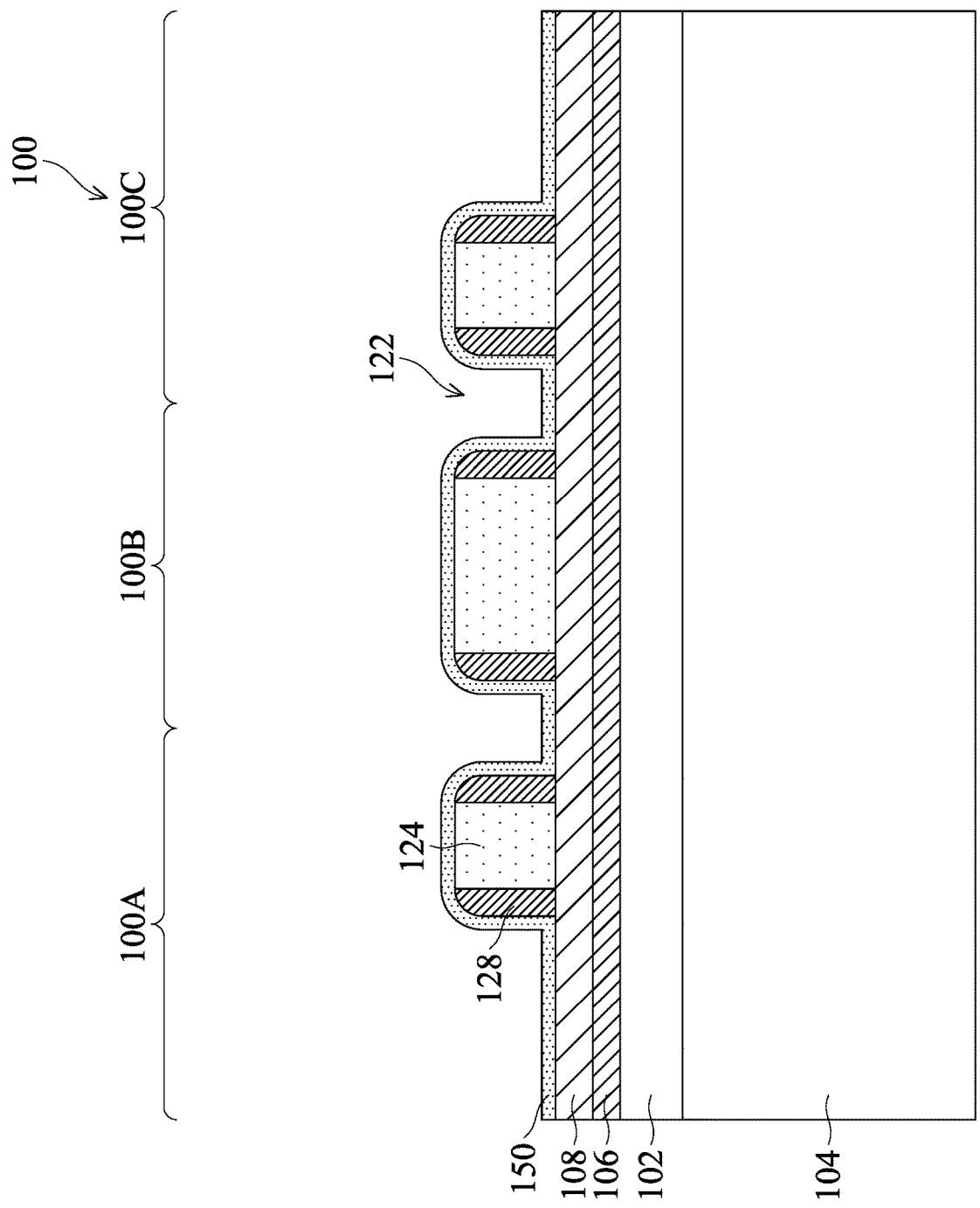

In FIG. 7, a mask 150 is formed over and along sidewalls of the mandrels 124 and the spacers 128. The mask 150 may further extend along top surfaces of the hard mask 108 in the openings 122. The material of the mask 150 is selected to have a high etching selectivity for a capping layer that is subsequently formed over the mandrels 124 and the spacers 128 (see e.g., FIG. 8). For example, the mask 150 may be comprise silicon oxide, or the like, and may be deposited using any suitable process such as ALD, CVD, or the like.

The deposition process of the mask 150 may be conformal so that a thickness of the mask 150 on sidewalls of the spacers 128 is substantially equal (e.g., within manufacturing tolerances) of a thickness of the spacer layer 126 on the top surface of mandrels 124 and bottom surfaces of the openings 122. In some embodiments, depositing the mask 150 may include flowing a first carbon-comprising precursor and oxygen (e.g., $O_2$, $N_2O$, $CO_2$, or the like) in an ALD deposition chamber. The first carbon-comprising precursor may be Bis(diethylamino)silane, $SiH_4$, $SiH_2Cl_2$, or the like, and the first carbon-comprising precursor may be a compound having a carbon to nitrogen ratio of 4:1, for example. The first carbon-comprising precursor and the oxygen react to form monolayers of silicon oxide on exposed surfaces of the device 100, for example. The first carbon-comprising precursor and oxygen may cyclically pulsed and purged with RF power (e.g., in a range of about 200 W to 800 W) being applied between each pulse and purge cycle. The RF power may improve a surface condition of each atomic monolayer to facilitate the growth of subsequent monolayers during the ALD process.

Figure 8:
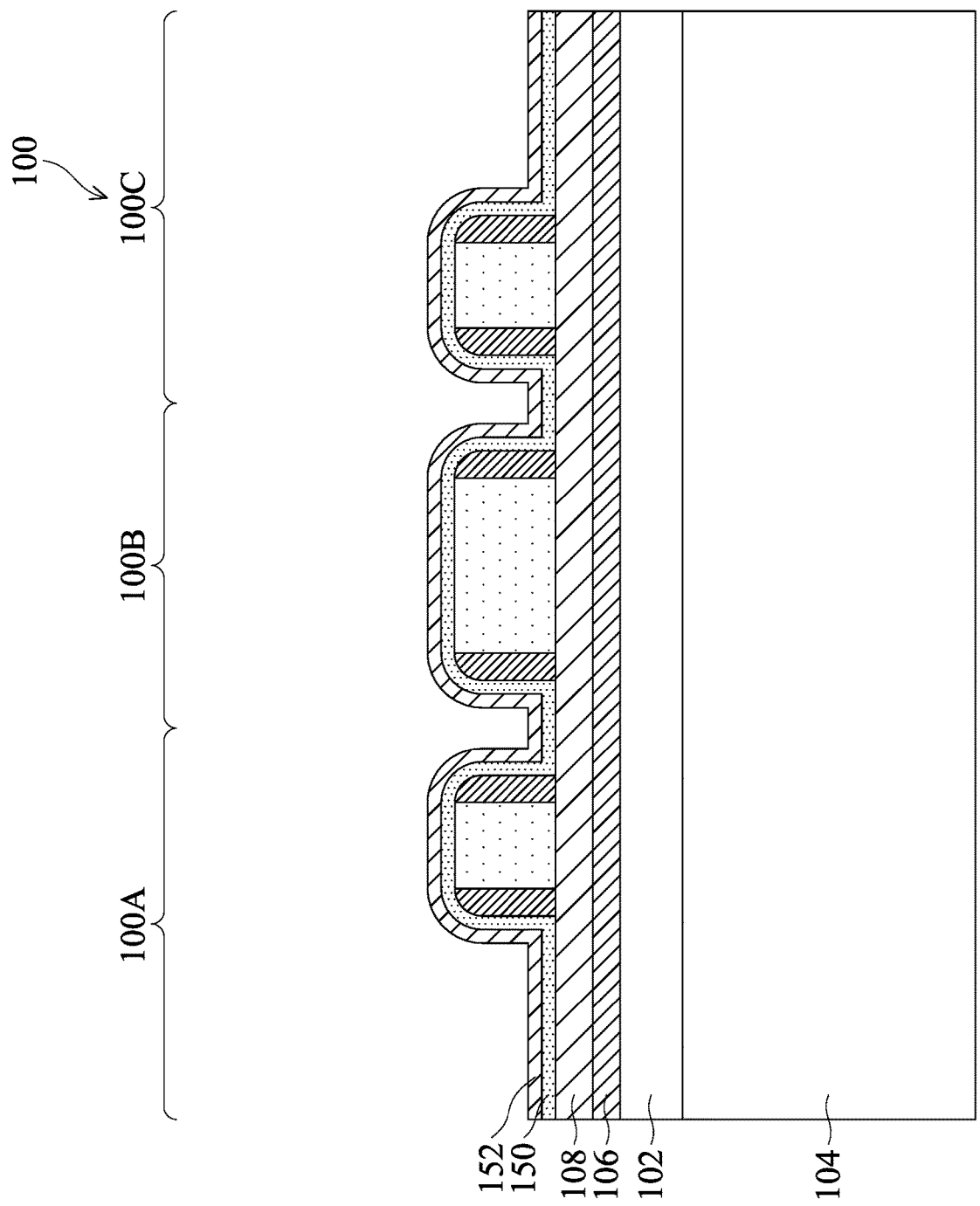

In FIG. 8, a capping layer 152 is formed on mask 150. The capping layer 152 may be a pure carbon layer or a carbon rich-composite layer (e.g., a SiOCN layer, a SiOC layer, or the like). For example, the carbon concentration of the capping layer 152 may be at least 30%, which advantageously allows the capping layer 152 to adequately protect the underlying spacers 128 during subsequent processing steps (e.g., subsequent etching steps to selectively remove the spacers 128 and/or the mandrels 124). It has been observed that a sufficiently high carbon concentration improves etching resistance compared to a material of the mask 150. For example, the wet etch rate of the capping layer 152 using diluted hydrogen fluoride (dHF) may be two times or more slower than the mask 150.

In some embodiments, the capping layer 152 may have a thickness less than about 2 nm, such as in a range of about 5 Å to about 15 Å or about 8 Å to about 9 Å. It has been observed that by forming the capping layer 152 in the above thickness ranges, advantages can be achieved. For example, forming a capping layer 152 of a thickness less than about 5 Å may provide insufficient protection to the underlying features (e.g., spacers 128) during subsequent etching steps resulting in damage to the underlying features. Further, forming a capping layer 152 of a thickness greater than about 2 nm may increase the difficulty of removing the capping layer 152, particularly in areas with small critical dimensions, resulting in undesired capping layer residue remaining in subsequent processing steps.

In some embodiments, the capping layer 152 is formed in-situ with the mask 150. For example, the capping layer 152 may be formed in a same process chamber as the mask 150 without any break in vacuum. In such embodiments, forming the capping layer 152 may include turning off flow of oxygen into the process chamber while flowing a second carbon-comprising precursor in the deposition chamber to deposit monolayers of pure carbon or monolayers of the carbon-rich composite material (e.g., having a carbon concentration greater than 30%). In some embodiments, the second carbon-comprising precursor used to deposit the capping layer 152 may be the same as the first carbon-comprising precursor described above that is flowed while depositing of the mask 150. For example, the second carbon-comprising precursor may be Bis(diethylamino)silane, $SiH_4$, $SiH_2Cl_2$, or the like, and the second carbon-comprising precursor may be a compound having a carbon to nitrogen ratio of 4:1. In other embodiments, the second carbon-comprising precursor may be a different compound than the first carbon-comprising precursor used to deposit the mask 150. Further, the second carbon-comprising precursor may have a carbon to nitrogen ratio that is greater than the carbon to nitrogen ratio of the first carbon-comprising precursor. Further, depositing the capping layer 152 may optionally include flowing one or more additional carbon-comprising precursors (e.g., Tetraethoxysilane (TEOS), Tetramethyl orthosilicate, or the like) concurrently with the second carbon comprising precursor. By controlling the carbon ratio of the second carbon-comprising precursor and/or flowing one or more additional carbon-comprising precursors, a carbon concentration of the capping layer 152 can be tuned to a desired level. In other embodiments, a different process may be used to form the capping layer 152, such as an ex-situ, deposition process where the capping layer 152 is formed in a different process chamber than the mask 150.

Figure 9:
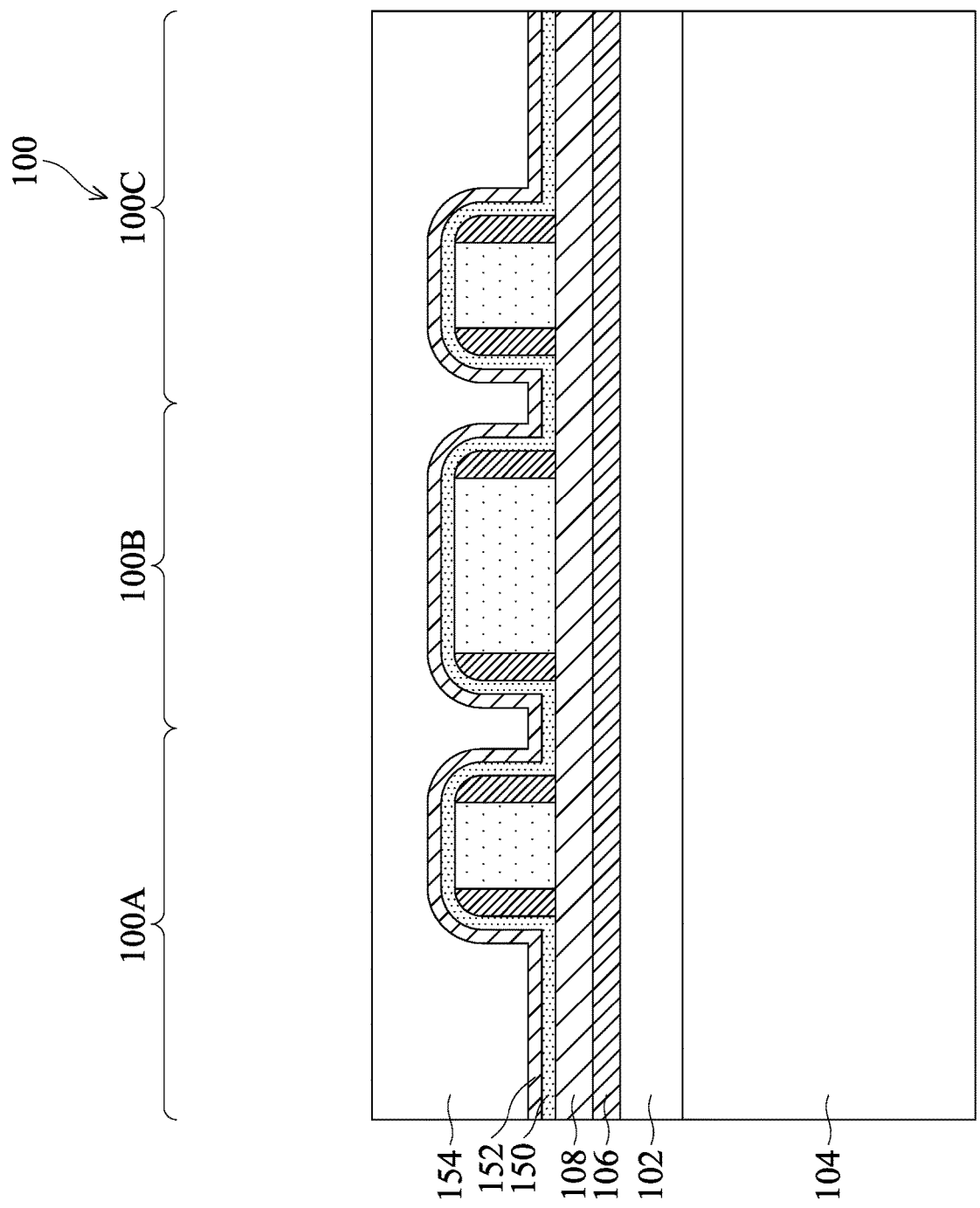

In FIG. 9, a photoresist 154 is deposited over the capping layer 152 in the regions 100A, 100B, and 100C. The photoresist 154 may be deposited using a spin-on process, for example. Although the photoresist 154 is illustrated as a single layer, in some embodiments, the photoresist 154 may have a tri-layer structure similar to the tri-layer photoresist 120 described above in FIG. 1.

Figure 10:
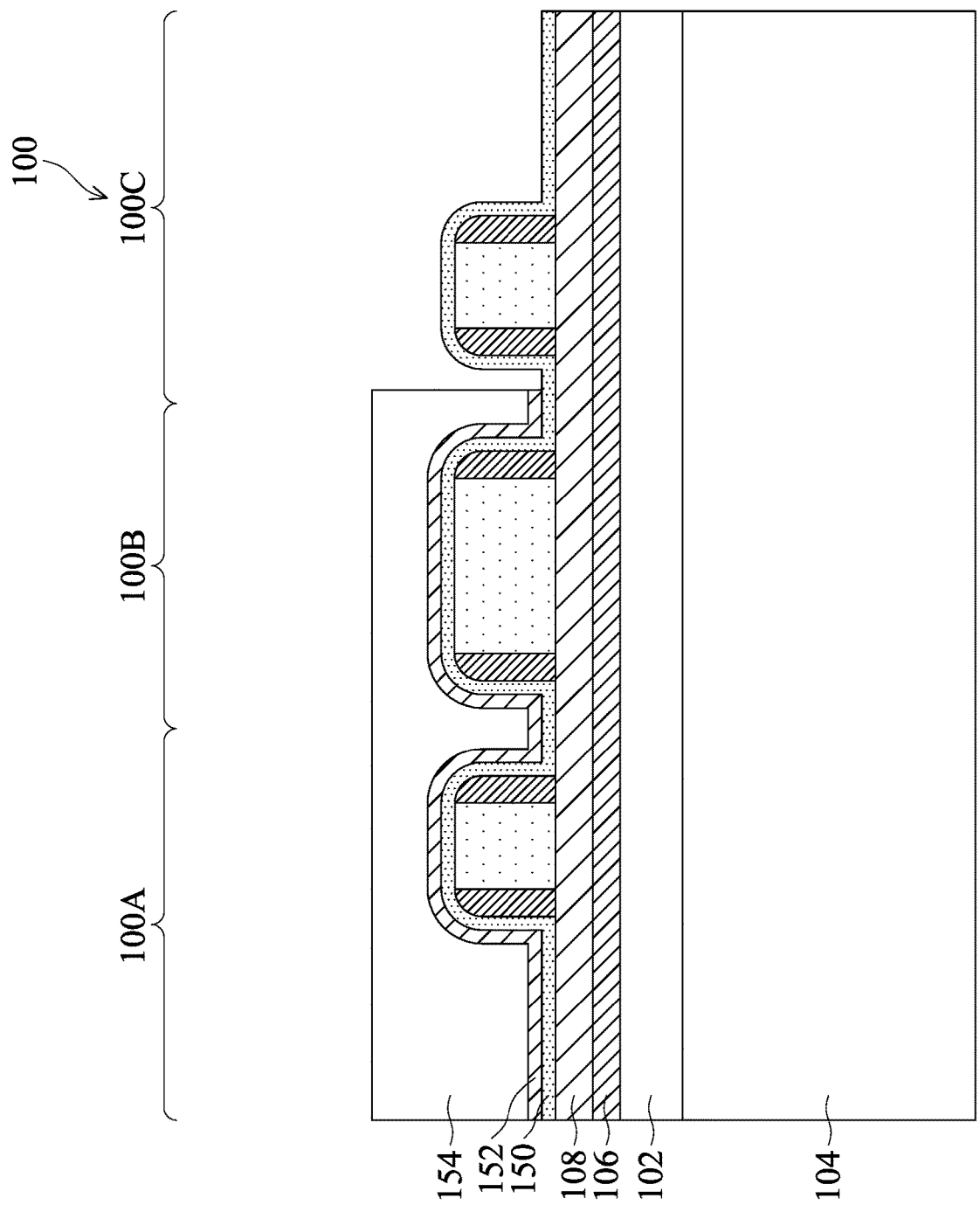

In FIG. 10, the photoresist 154 and capping layer 152 are patterned to expose the mask 150 in the region 100C. Patterning the photoresist 154 may be performed using a photolithographic process. For example, the photoresist 154 may be exposed and developed to remove the photoresist 154 from the region 100C while leaving the photoresist 154 in the regions 100A and 100B. Further, in embodiments where the photoresist 154 has a tri-layer structure, patterning the photoresist 154 may further include suitable etch processes as described above with respect to patterning the photoresist 120. In some embodiments, removing the photoresist 154 from the region 100C may comprise an $O_2$ ashing process, which further removes the capping layer 152 from the region 100C. The remaining portions of the photoresist 154 in the regions 100A and 100B may be cover portions of the capping layer 152 such that the capping layer 152 also remains in the regions 100A and 100B.

Figure 11:
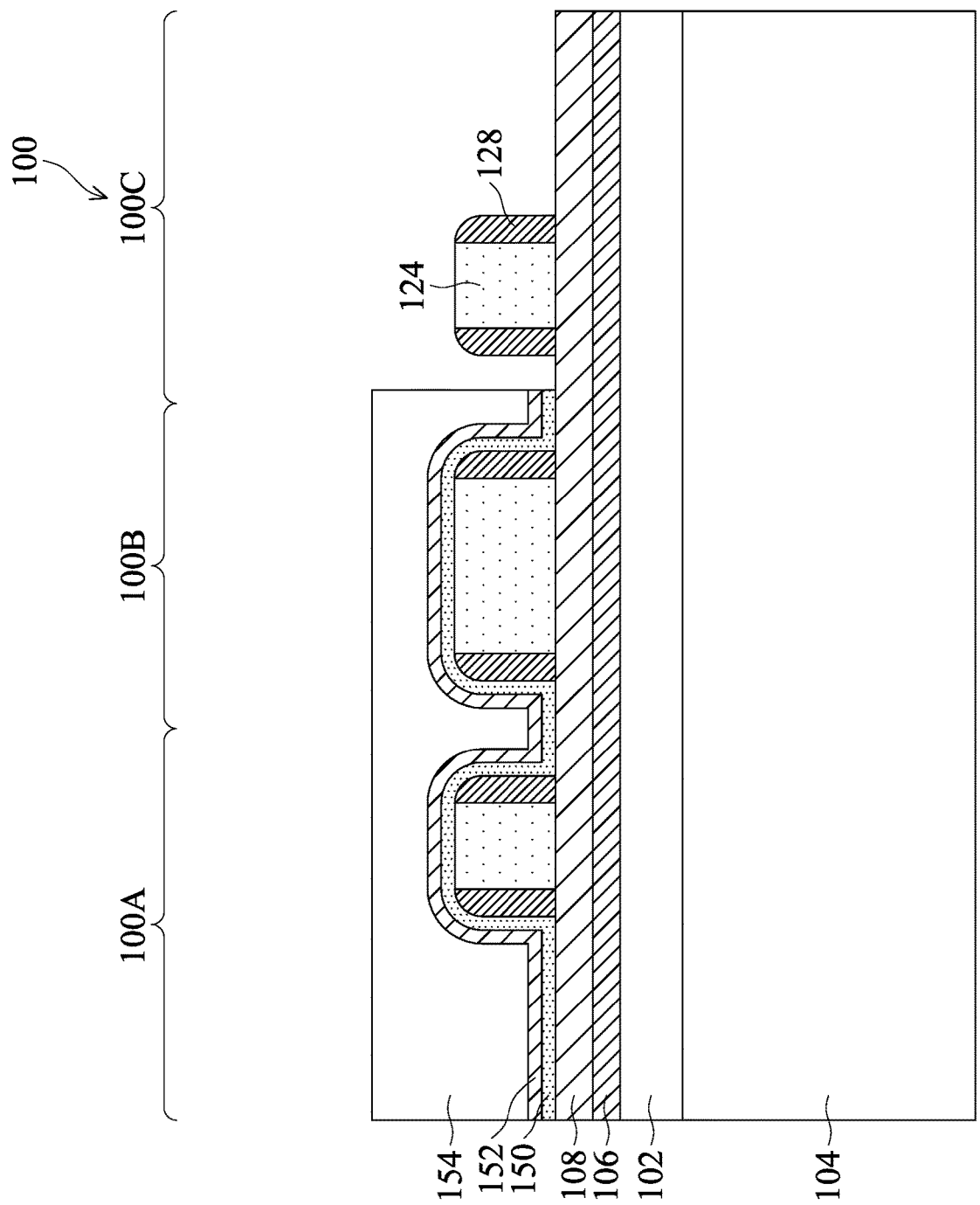

In FIG. 11, the mask 150 is selectively removed from the region 100C. Patterning the mask 150 may be performed by a wet etching process using the photoresist 154 and the capping layer 152 as masks. The wet etching process may use dHF, or the like as an etchant. According, the mandrels 124 and the spacers 128 are exposed in the region 100C. In various embodiments, the capping layer 152 protects the spacers 128 in the regions 100A and 100B while patterning the mask 150. For example, the wet etchants (e.g., dHF) used to etch the mask 150 tends to penetrate the photoresist 154 and etch the mask 150 in the regions 100A and 100B, resulting in damage to the spacers 128 (e.g., material loss). As described above, the capping layer 152 (e.g., a carbon-rich material) is resistant to etching by such etchants (e.g., dHF), and the capping layer 152 provides an additional protective layer in the regions 100A and 100B that reduces damage to the spacers 128 (e.g., reduces material loss in the spacers 128). Accordingly, patterning precision can be improved. Further, the spacers 128 may be removed from the region 100C in subsequent processing steps, and damage to the spacers 128 in the region 100C as a result of patterning the mask 150 may not result in reduced of patterning control.

Figure 12:
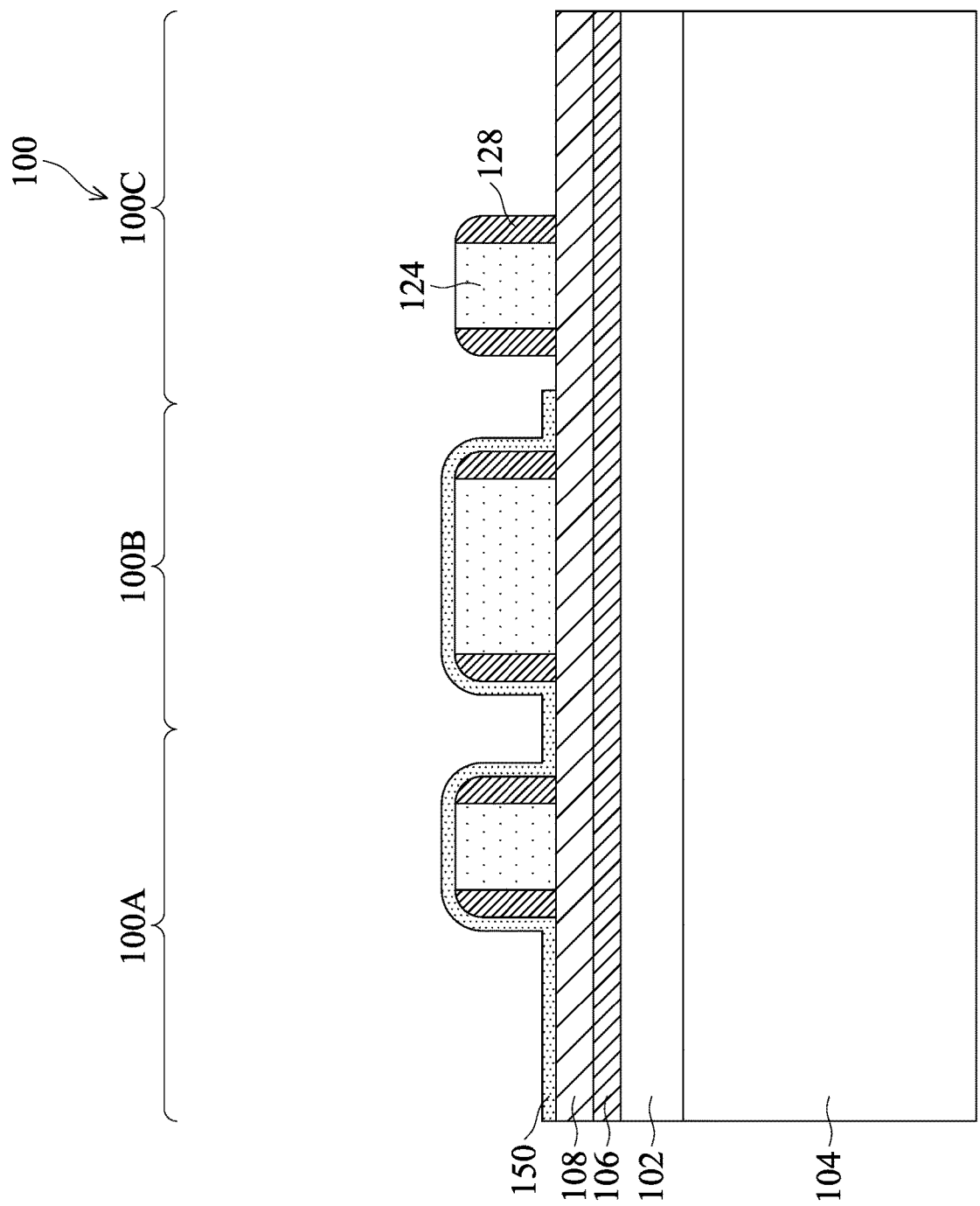

In FIG. 12, remaining portions of the photoresist 154 and the capping layer 152 are removed by etching from the regions 100A and 100B. Removing the photoresist 154 and the capping layer 152 may include a cleaning process using a high temperature sulfuric peroxide mixture (HTSPM), for example, that removes both the photoresist 154 and the capping layer 152. As a result, the mask 150 is exposed in the regions 100A and 100B. Optionally, a relatively fast (e.g., performed for a duration of less than 30 s) cleaning process using dHF may be performed to clean exposed surfaces of the mask 150 without damaging the underlying spacers 128. The cleaning may facilitate removal of residue photoresist 154 to form the surfaces of the mask 150.

Figure 13:
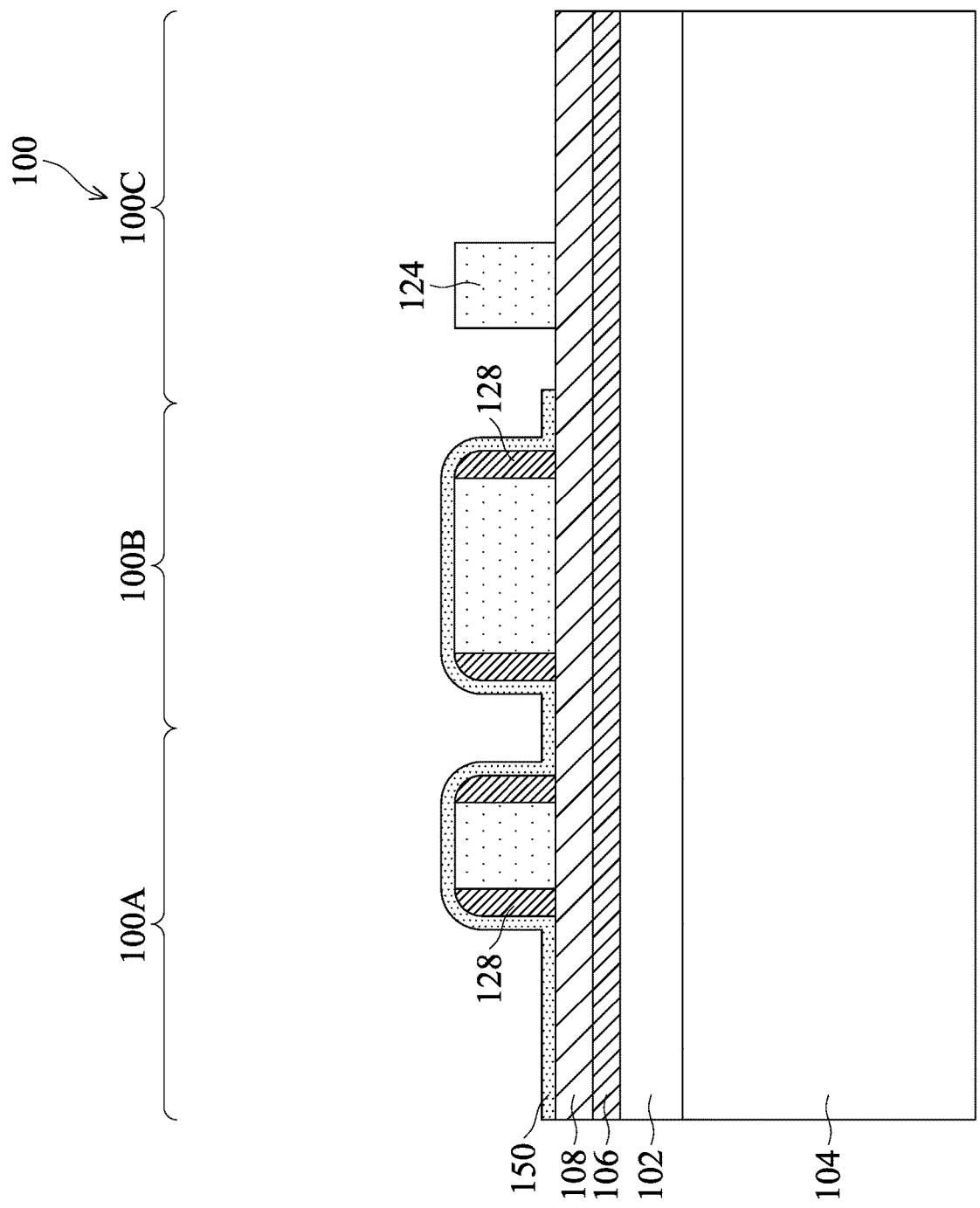

In FIG. 13, the spacers 128 are removed from the region 100C using a suitable etching process that selectively removes the spacers 128 without removing the mask 150. In some embodiments, the spacers 128 can be removed from the region 100C using a $H_3PO_4$, ozone, or the like as an etchant. Spacers 128 in regions 100A and 100C are masked by the mask 150 and not removed.

Figure 14:
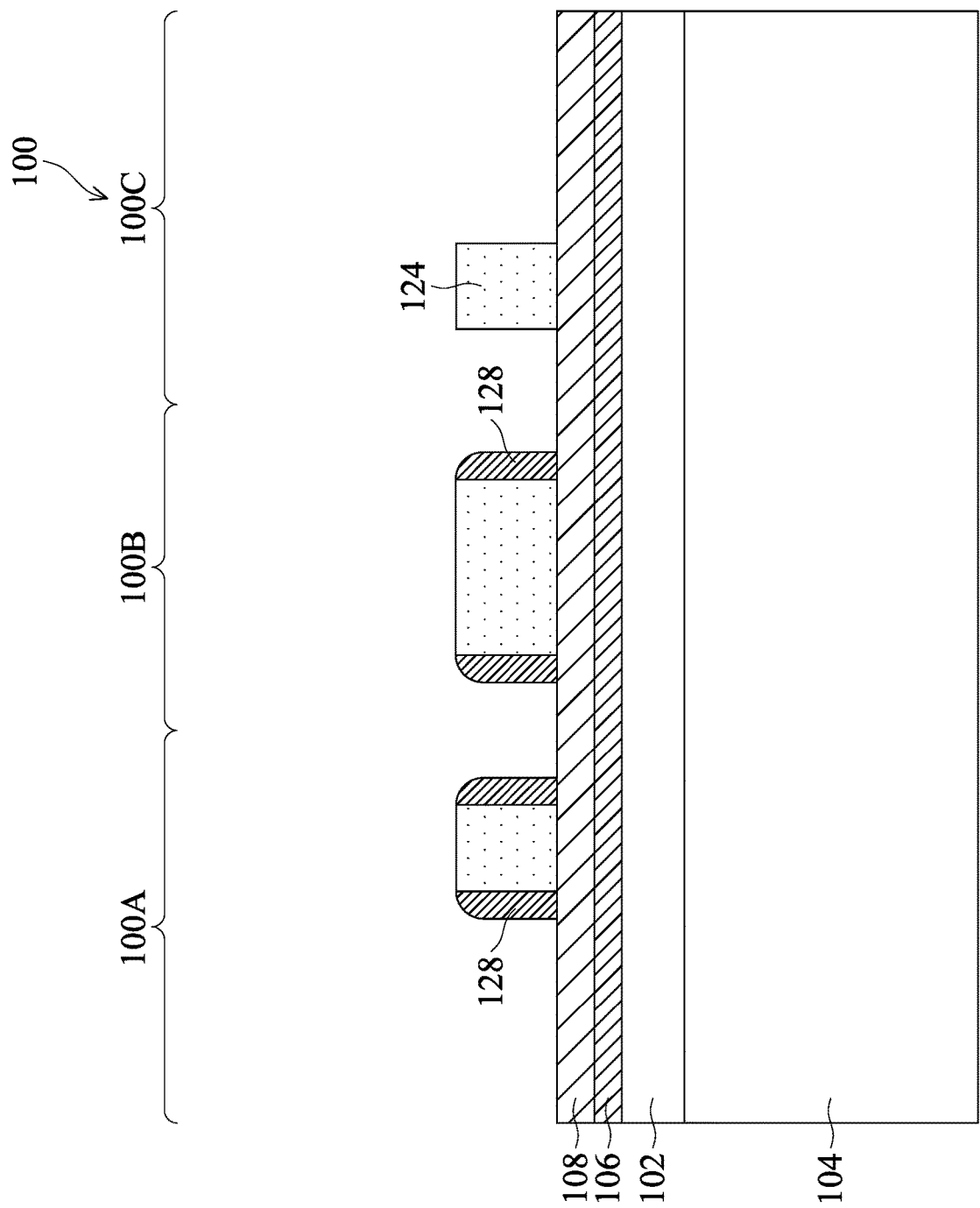

In FIG. 14, the mask 150 is removed from regions 100A and 100B by an etching process. In some embodiments, removing the mask 150 (e.g., an oxide) may use an etching process that etches the mask 150 at a lower rate than the underlying hard mask layer 106 (e.g., a nitride layer). For example, the etching process to remove the mask 150 uses dHF or the like as an etchant. Other etching processes may be used in other embodiments.

Figure 15:
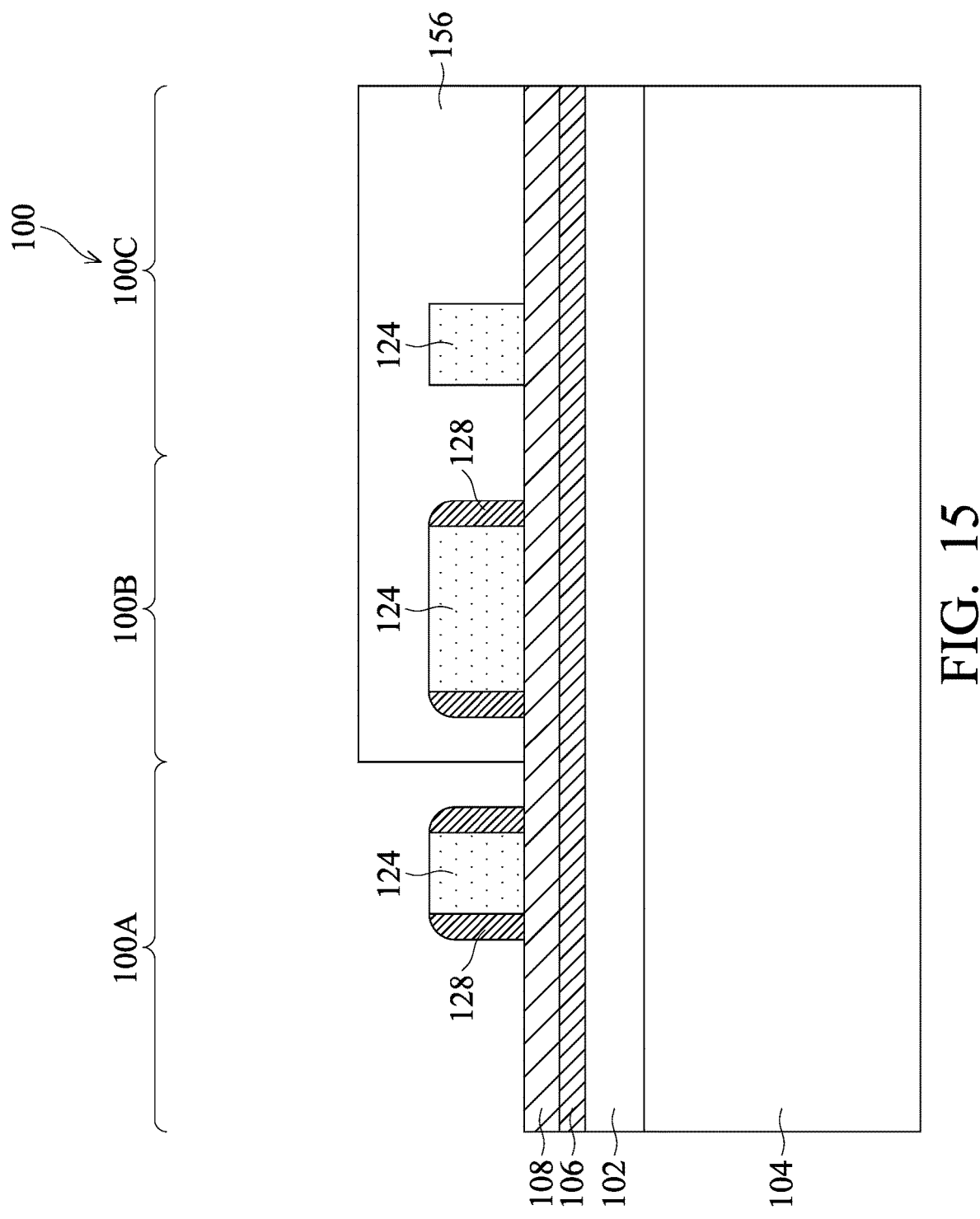

In FIG. 15, a photoresist 156 is deposited over the spacers 128 and the mandrels 124 in the regions 100A, 100B, and 100C. The photoresist 156 may be deposited using a spin-on process, for example. Although the photoresist 156 is illustrated as a single layer, in some embodiments, the photoresist 156 may have a tri-layer structure similar to the tri-layer photoresist 120 described above in FIG. 1. As further illustrated in FIG. 15, the photoresist 156 may be patterned to expose the spacers 128 and the mandrels 124 in the region 100A. Patterning the photoresist 156 may be performed using a suitable lithography and/or etch process as described above (e.g., with respect to patterning the photoresist 120).

Figure 16:
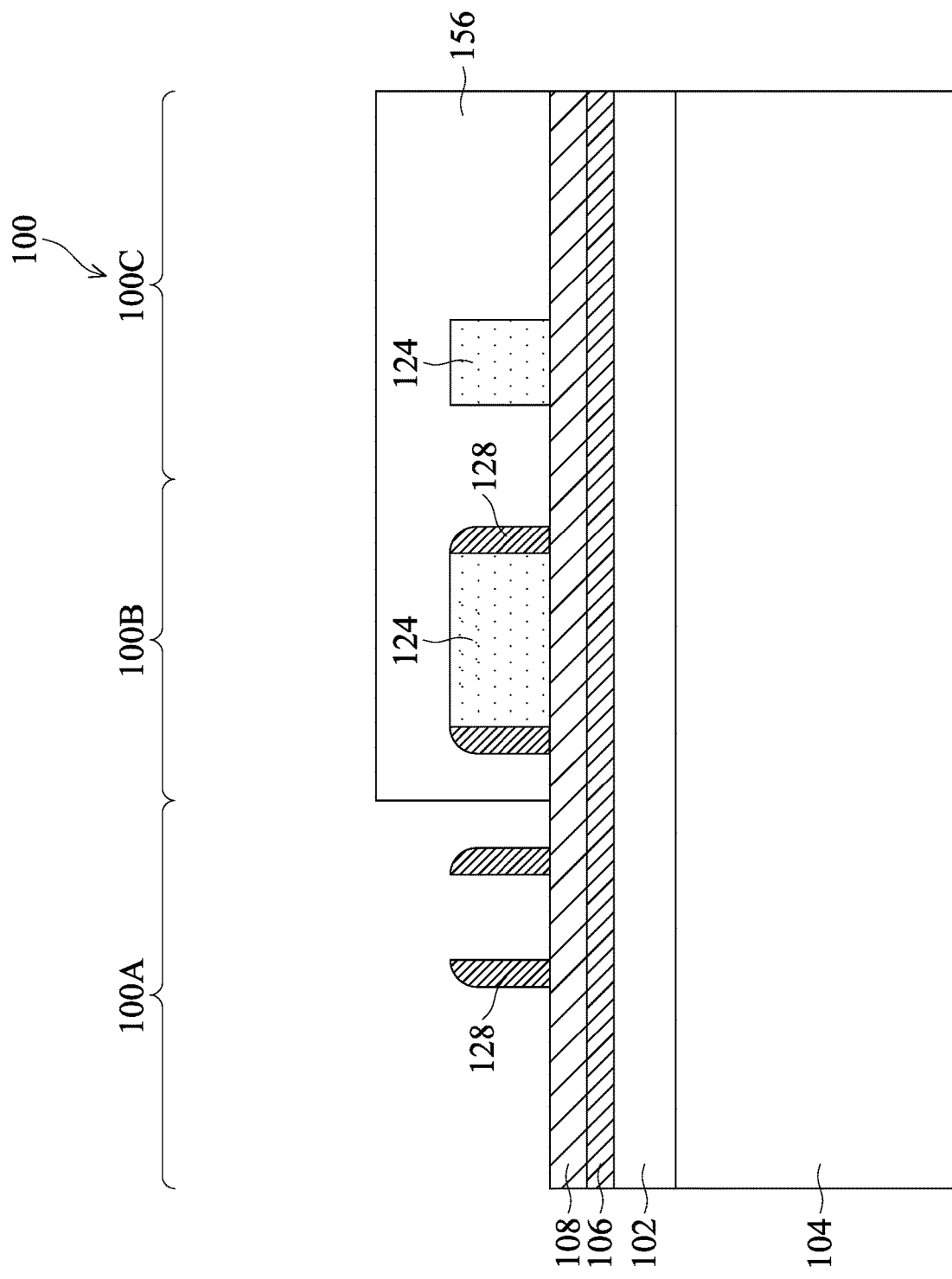
Figure 17:
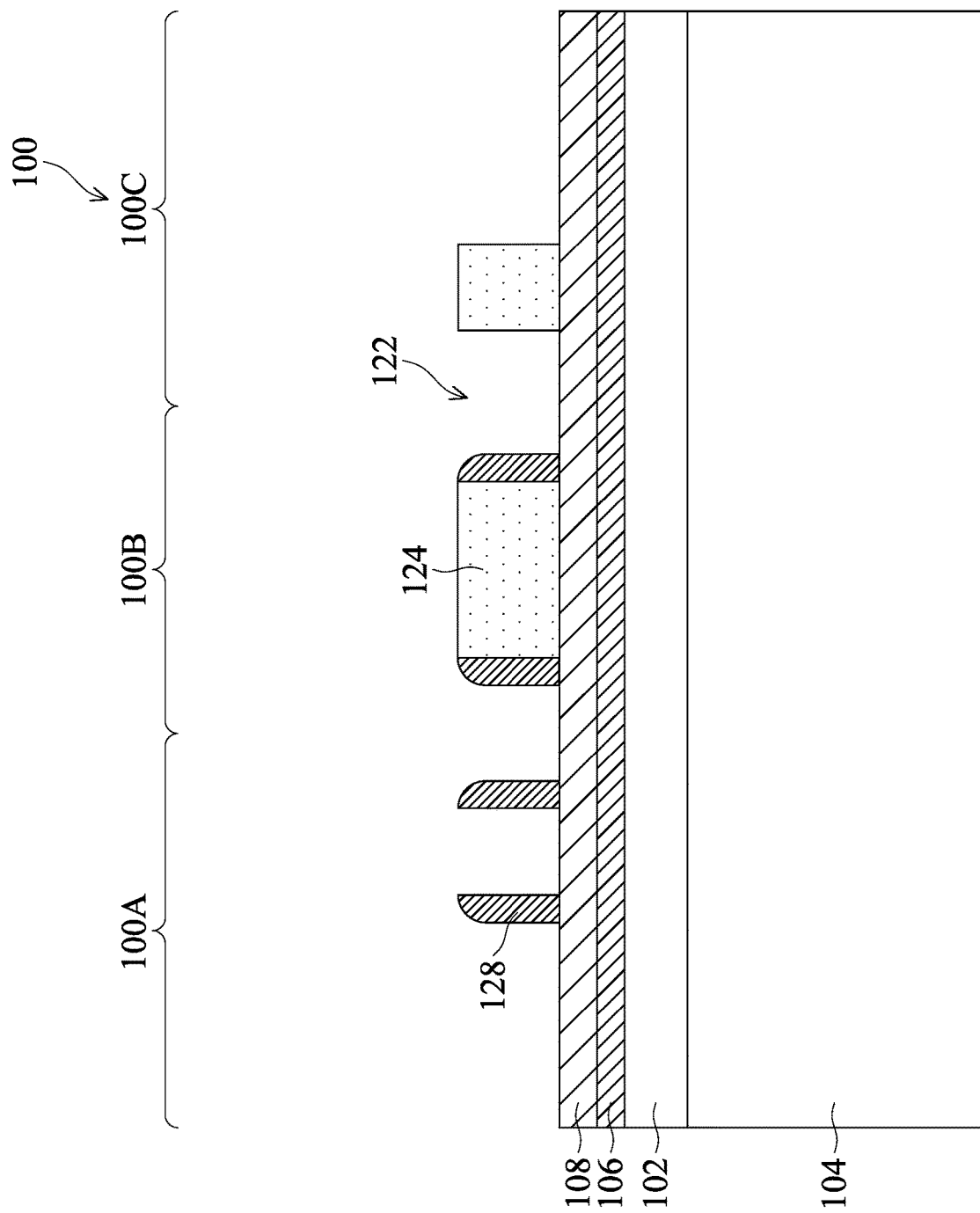

In FIG. 16, mandrels 124 are removed from region 100A. The mandrels 124 are removed using an etching process. Because the mandrels 124 and the spacers 128 have etch selectivity relative a same etch process, the mandrels 124 may be removed without removing the spacers 128. Etching the mandrels 124 exposes the underlying hard mask 108, which may act as an etch stop layer. In some embodiments, etching the mandrels 124 may reduce a height of the spacers 128 without removing the spacers 128. Removing the mandrels 124 may comprise a dry etch process similar to the process used to pattern the mandrels 124 as described above in FIG. 4. Subsequently, the photoresist 156 is removed using an acceptable cleaning and/or 02 ashing process. The resulting structure is illustrated in FIG. 17.

Figure 18:
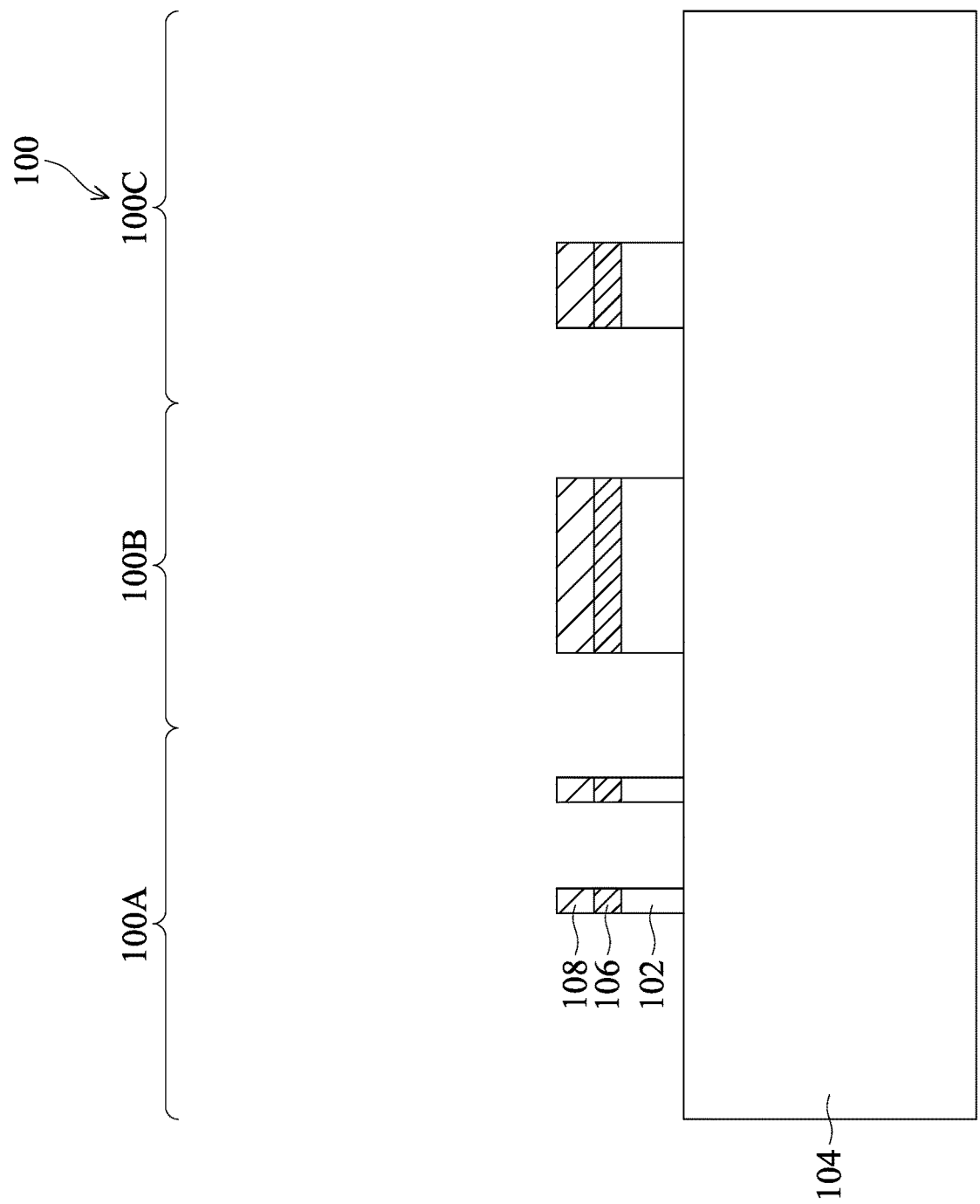

In FIG. 18, the hard mask 108 is etched using the spacers 128 and mandrels 124 as an etching mask. Specifically, the hard mask 108 is patterned using the spacers 128 as a mask in the region 100A; the hard mask 108 is patterned using a combination of the spacers 128 and the mandrels 124 as a mask in the region 100B; and the hard mask 108 is patterned using the mandrel 124 as a mask in the region 100C. Thus, the hard mask 108 may be patterned to have different spacings and feature sizes in each of the regions 100A, 100B, and 100C by using different combinations of the spacers 128 and/or the mandrels 124.

In some embodiments, etching the hard mask 108 comprises an anisotropic dry etch and/or wet etch. For example, the hard mask 108 may be patterned by dry etching (e.g., using $CF_4$, $NF_3$, HCl, HBr, or the like), a subsequent wet etch (e.g., using diluted hydrogen fluoride (DHF), sulfur peroxide mix (SPM), or the like) for by-product removal, and a cleaning process (e.g., standard clean 1 (SC-1) or the like) for particle cleaning. Etching the hard mask 108 may consume the spacers 128.

Figure 19:
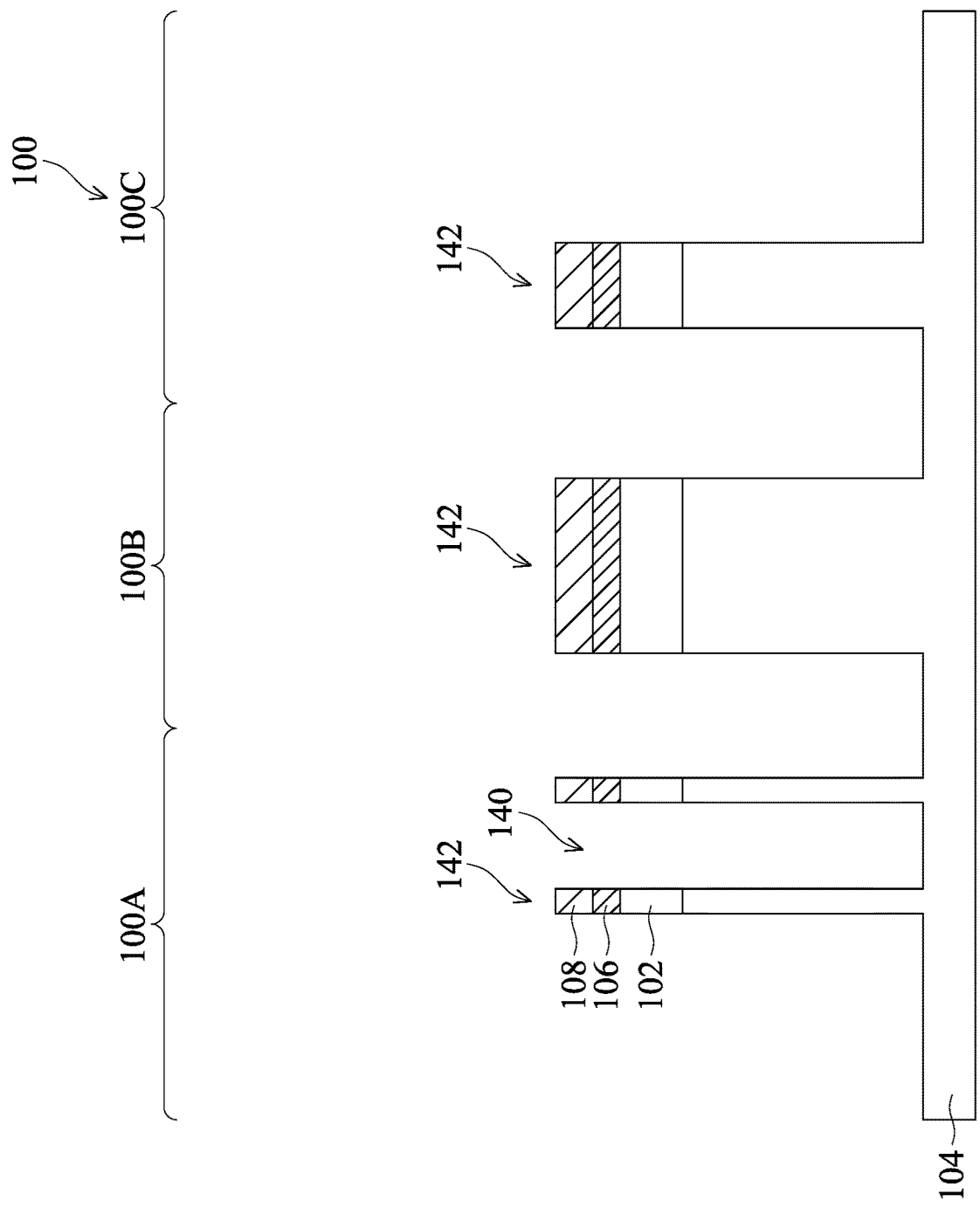

Subsequently, in FIG. 19, the hard mask 108 is used as an etching mask to pattern openings 140 in the target layer 104, which may define fins 142. Etching the target layer 104 may comprise an anisotropic dry etch process and/or a wet etch process. Remaining portions of the target layer 104 may have a same pattern as the spacers 128 and mandrels 124 of FIG. 17. Because different combinations of the spacers 128 and the mandrels 124 are used as masks, different sizes and spacings of the fins 142 may be achieved in the target layer 104 in each of the regions 100A, 100B, and 100C.

Figure 20:
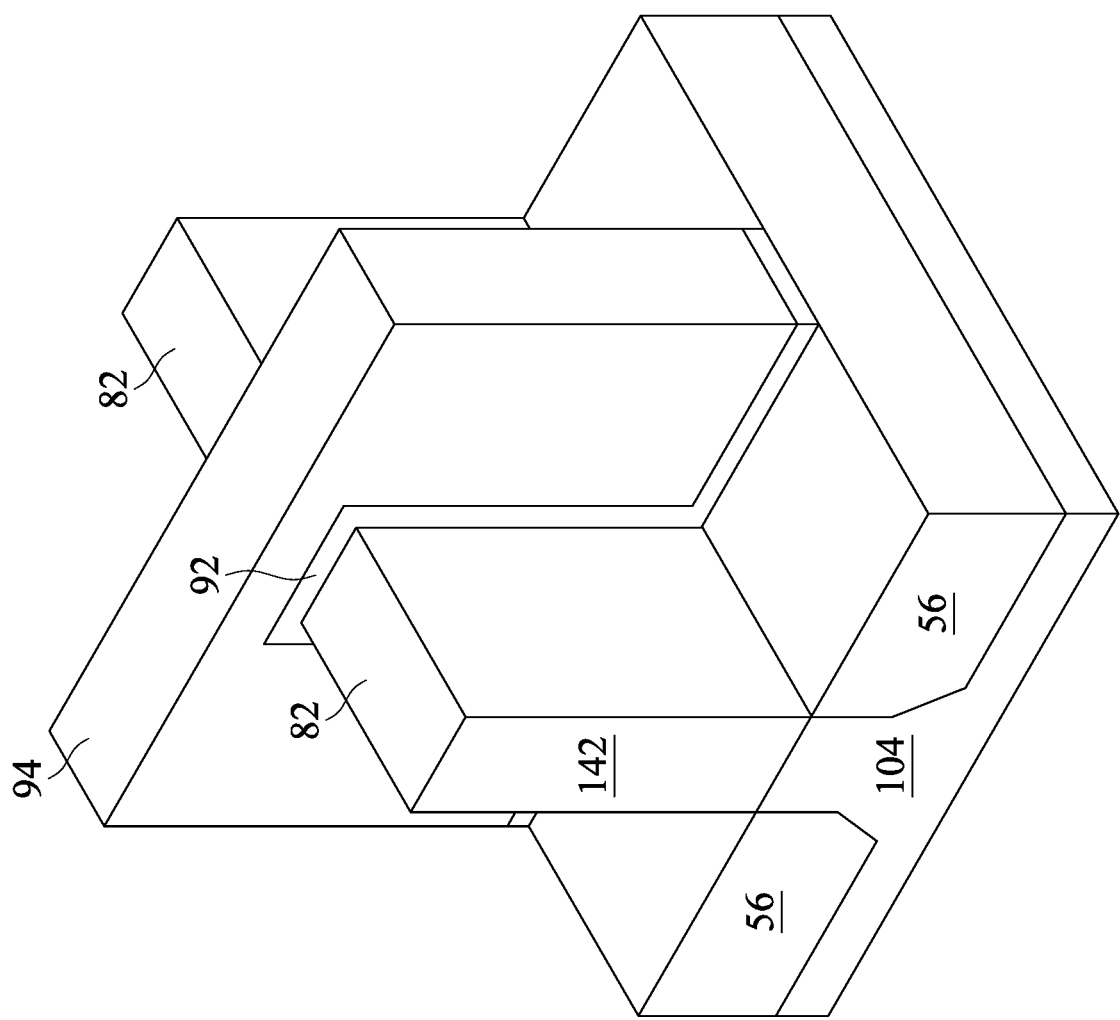

Additional process steps may be applied to structure 100 to form fin field effect transistor (FinFET) devices. FIG. 20 illustrates a finFET device in a perspective view. In various embodiments, isolation regions may be deposited around the fins 142, and the isolation regions may then be recessed to expose upper portions of the fins 142. Openings may be patterned in the upper portions of the fins 142, and epitaxial source/drain regions may be grown in the openings. Further, gate structures may be formed over and along sidewalls of upper portions of the fins 142. The FinFET comprises a fin 142, which may be patterned according to the processes described in FIGS. 1-19, above. The fin 142 protrudes above and from between neighboring isolation regions 56. A gate dielectric layer 92 is along sidewalls and over a top surface of the fin 142, and a gate electrode 94 is over the gate dielectric layer 92. Source/drain regions 82 are disposed in opposite sides of the fin 142 with respect to the gate dielectric layer 92 and gate electrode 94.

The target layer 104 in the above embodiment is a singular layer of material. In other embodiments, the target layer 104 may have a multilayer structure or a combination of singular layers/multilayer structures in different ones of the regions, 100A, 100B, or 100C.

Figure 21:
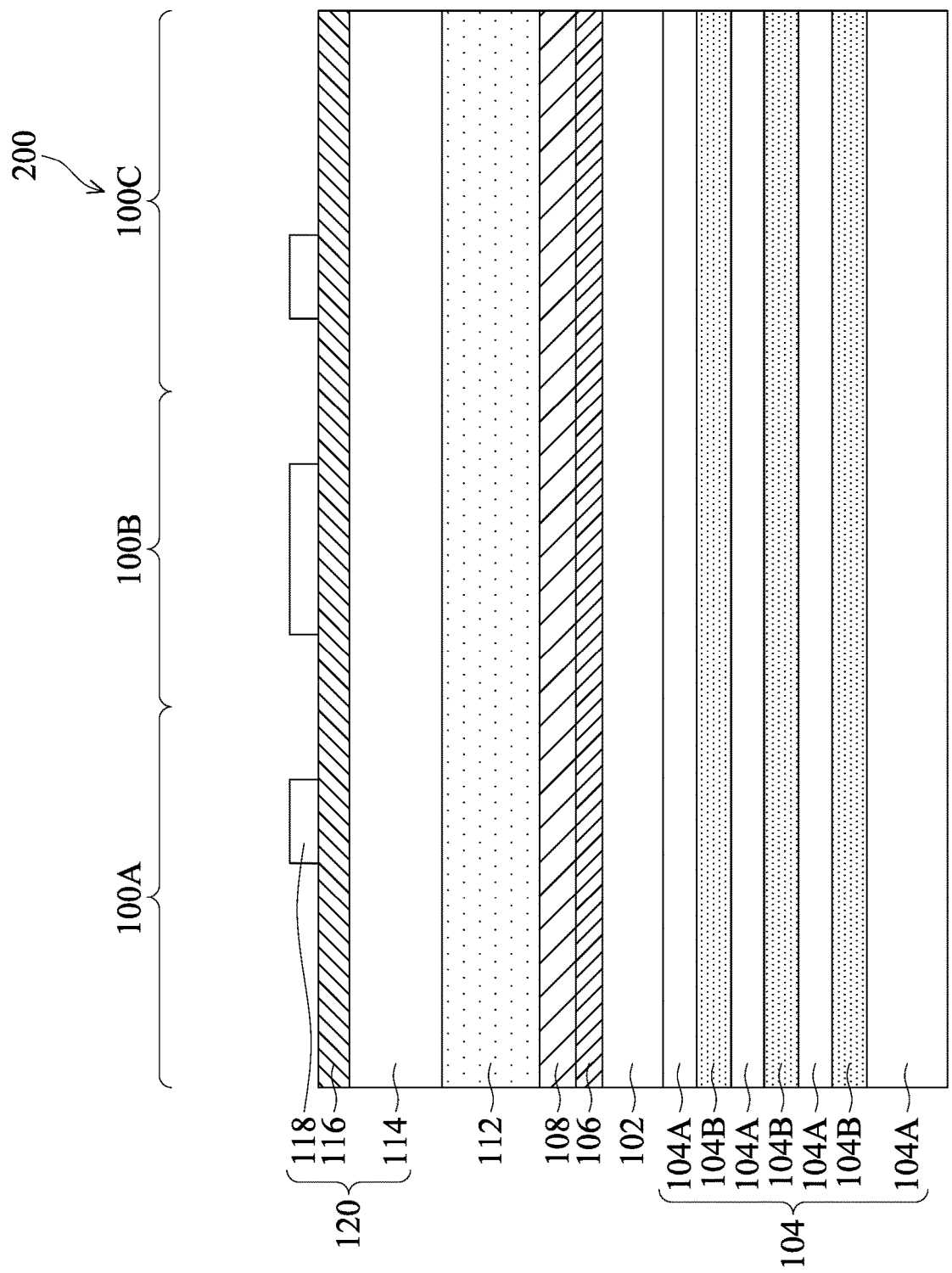
FIGS. 21, 22, and 23 illustrate cross-sectional and perspective views of various intermediary stages of manufacturing a semiconductor device according to various other embodiments.
Figure 22:
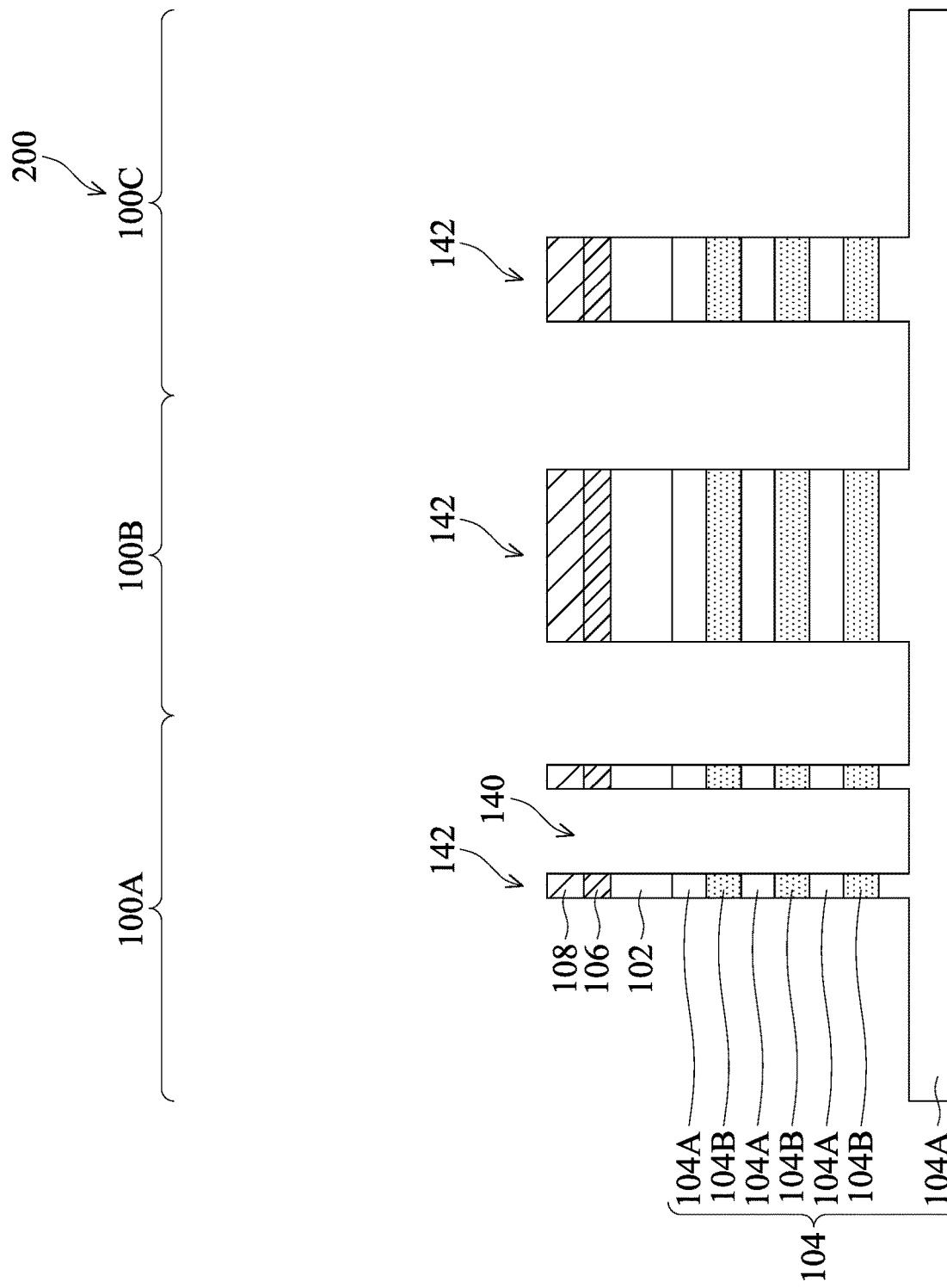

For example, FIGS. 21 and 22 illustrate an embodiment where the target layer 104 has a multilayer structure with alternating semiconductor layers 104A and 104B. The semiconductor layers 104A may comprise a first semiconductor material, and the semiconductor layers 104B may comprise a second semiconductor material that can be selectively etched compared to the first semiconductor material. For example, the semiconductor layers 104A may comprise silicon while the semiconductor layers 104B may comprise silicon germanium. The semiconductor layers 104B may be removed subsequently and the semiconductor layers 104A may be patterned to form channel regions of a nanostructure transistor device. In some embodiments, the nanostructure transistor can be a nanowire transistor, a nanosheet transistor, a gate all around transistor, or the like.

FIG. 21 illustrates an initial device 200 similar to the device 100 of FIG. 1 where like reference numerals indicate like elements formed using like processes. FIG. 22 illustrates the device 200 after the target layer 104 is patterned to define fins 142 using a similar process as described above with respect to FIGS. 1-19. For example, different combinations of spacers and/or mandrels are used to define fins 142 of different sizes and spacing in different regions 100A, 100B, and 100C of the device 200. A carbon layer or carbon rich layer may be used as a capping layer to protect spacers in the regions 100A and 100B while the spacers are selectively removed from the region 100C. Accordingly, improved patterning control of the fins 142 can be achieved.

Additional process steps may be applied to device 200 to form nanostructure transistor devices. For example, isolation regions may be deposited around the fins, and the isolation regions may then be recessed to expose upper portions of the fins. Openings may be patterned in the upper portions of the fins, and epitaxial source/drain regions maybe grown in the openings. Further, the semiconductor layers 104A may be removed, and the semiconductor layers 104B may be patterned to define channel regions. Gate structures may be formed around the channel regions.

Figure 23:
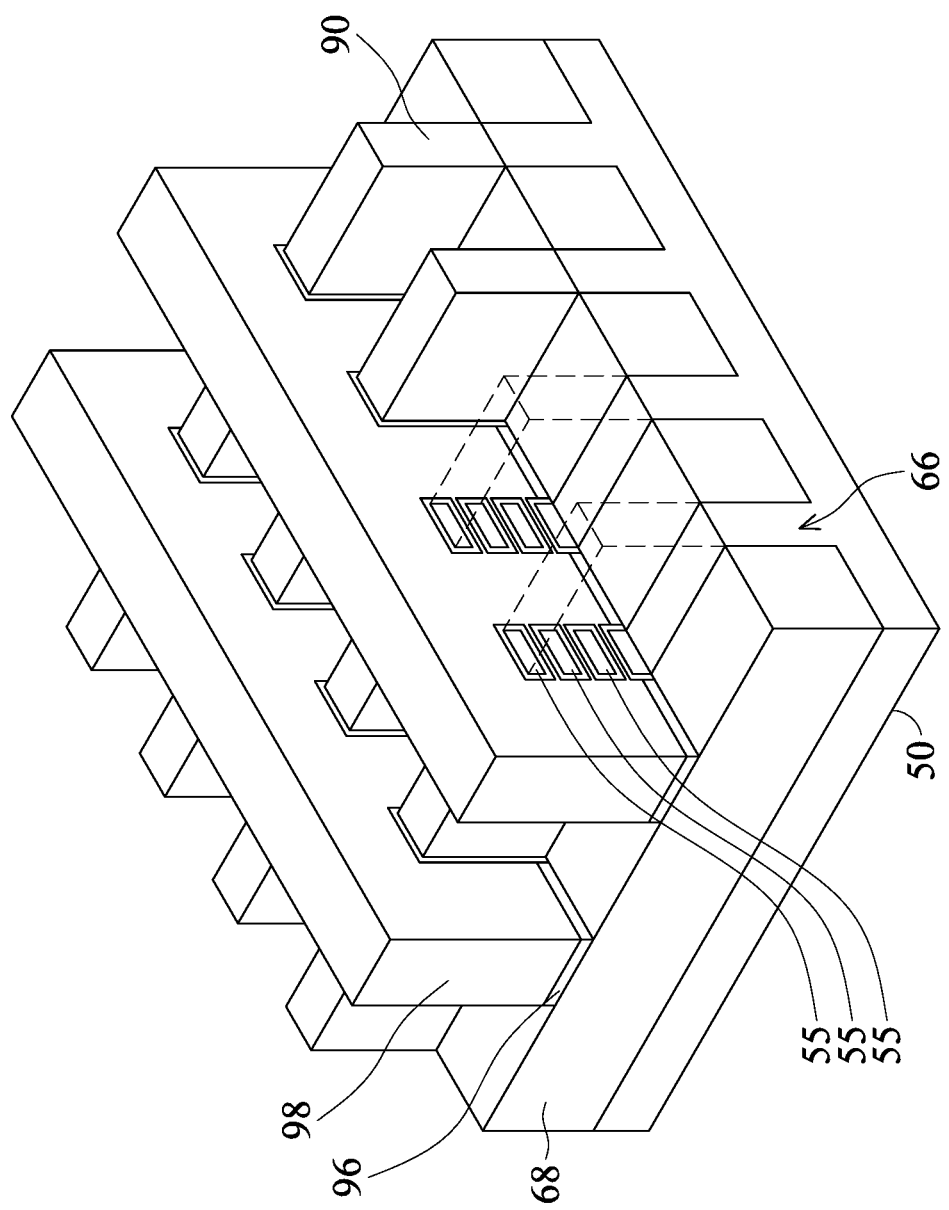

FIG. 23 illustrates an example of a nanostructure transistor in a three-dimensional view, in accordance with some embodiments. The nanostructure transistors comprise nanostructures 55 (e.g., nanosheets, nanowire, or the like) over fins on a substrate 50 (e.g., a semiconductor substrate), wherein the nano-structures 55 act as channel regions for the nanostructure transistors. The nanostructures 55 may be formed by patterning the semiconductor layers 104A. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Figure 24:
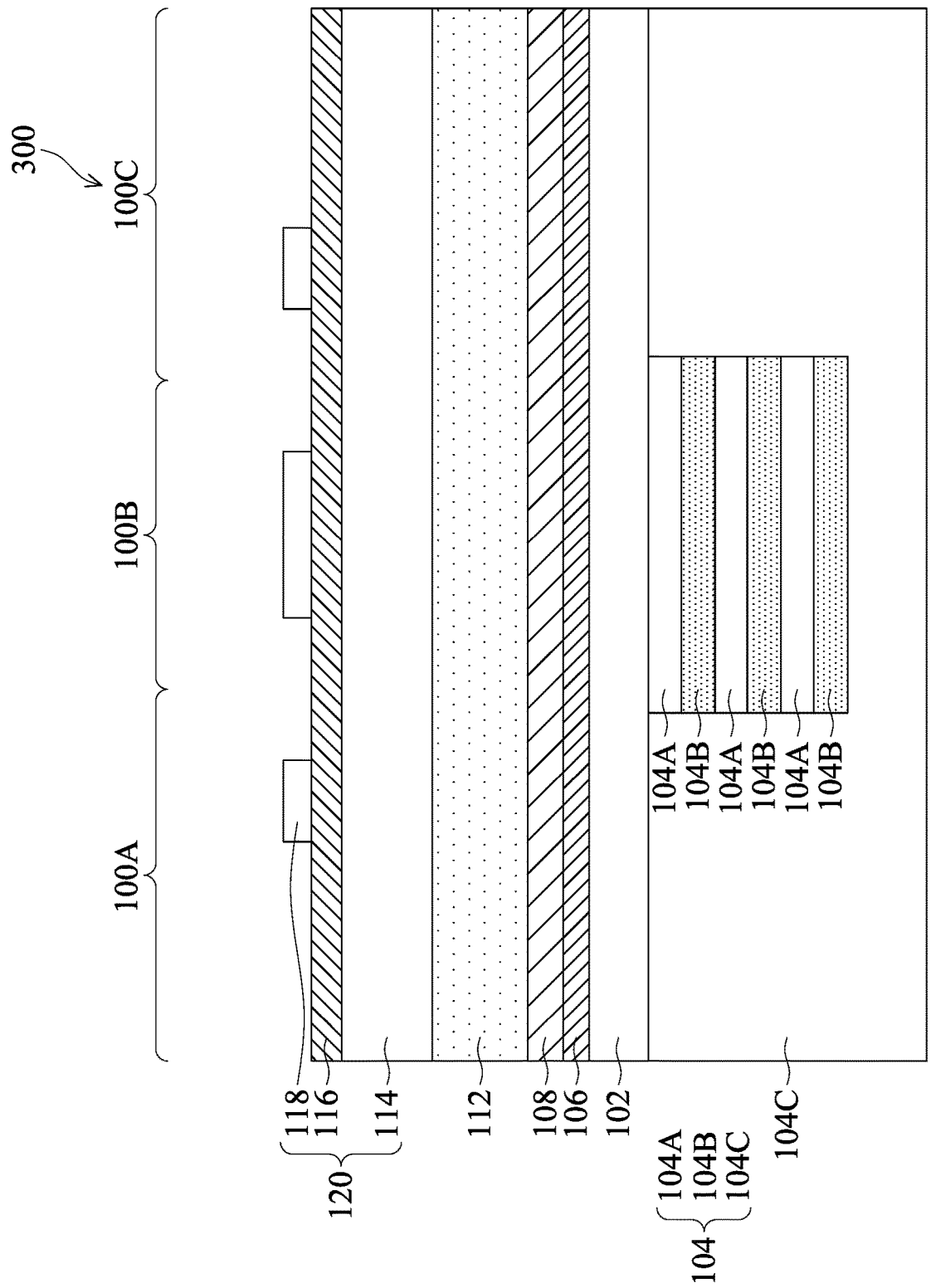
FIGS. 24 and 25 illustrate cross-sectional and perspective views of various intermediary stages of manufacturing a semiconductor device according to various other embodiments.
Figure 25:
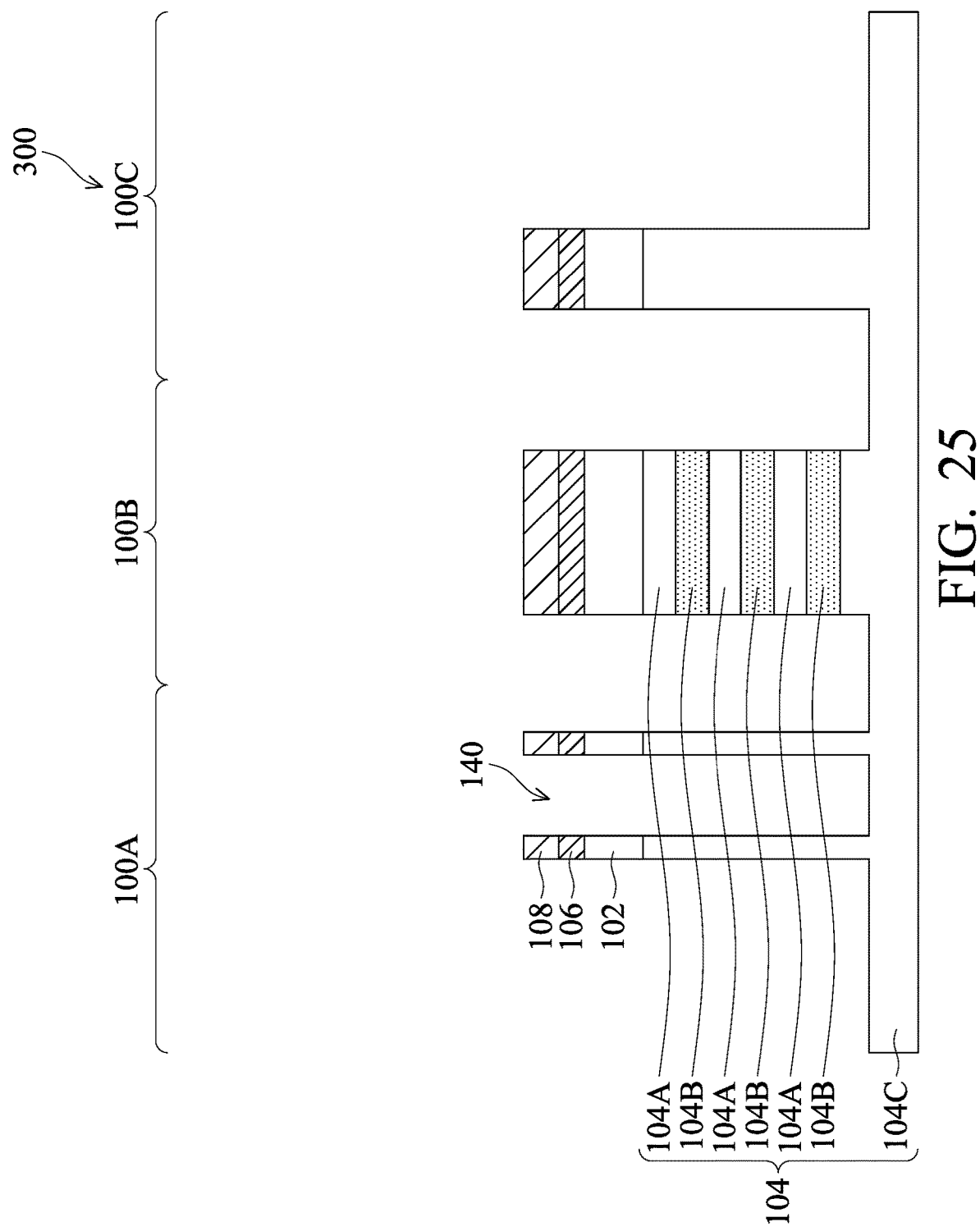

FIGS. 24 and 25 illustrate an alternative embodiment where the target layer 104 comprises a multilayered structure (e.g., semiconductor layers 104A/104B) embedded in a semiconductor substrate 104C. The multilayer structure may be disposed in the region 100B, and the multilayer structure may not extend into the regions 100A or 100C. The semiconductor substrate 104C may comprise silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The target layer 104 of FIGS. 24 and 25 may be formed, for example, by patterning a recess in the semiconductor substrate 104C in the region 100B using a combination of photolithography and etching. Next, semiconductor layers 104A and 104B may by alternately grown in the recess of the semiconductor substrate 104C. The semiconductor layers 104A and 104B may be similar to those described above with respect to FIGS. 21 and 22.

FIG. 24 illustrates an initial device 300 similar to the device 100 of FIG. 1 where like reference numerals indicate like elements formed using like processes. FIG. 25 illustrates the device 300 after the target layer 104 is patterned to define fins 142 using a similar process as described above with respect to FIGS. 1-19. For example, different combinations of spacers and/or mandrels are used to define fins 142 of different sizes and spacing in different regions 100A, 100B, and 100C of the device 300. A carbon layer or carbon rich layer may be used as a capping layer to protect the spacers in the regions 100A and 100B while the spacers are selectively removed from the region 100C. The fins 142 may have a monolithic composition in the regions 100A and 100C while the fins 142 have a multilayer structure (e.g., comprising the semiconductor layers 104A and 104B) in the region 100B. Additional process steps as described above may be applied to device 300 to form nanostructure transistor devices in the region 100B and finFET transistors in the regions 100A and 100C.

Figure 26:
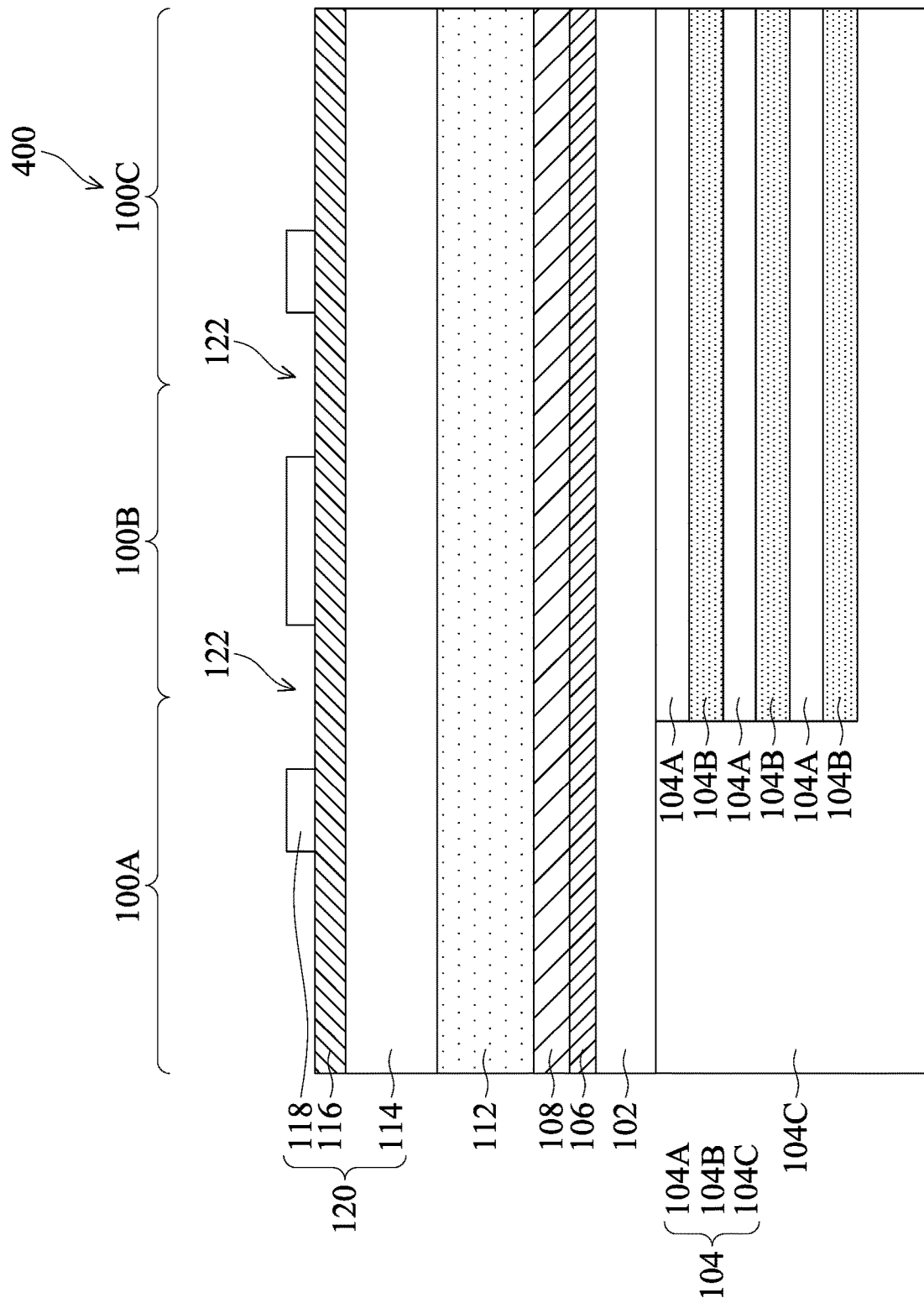
FIGS. 26 and 27 illustrate cross-sectional and perspective views of various intermediary stages of manufacturing a semiconductor device according to various other embodiments.
Figure 27:
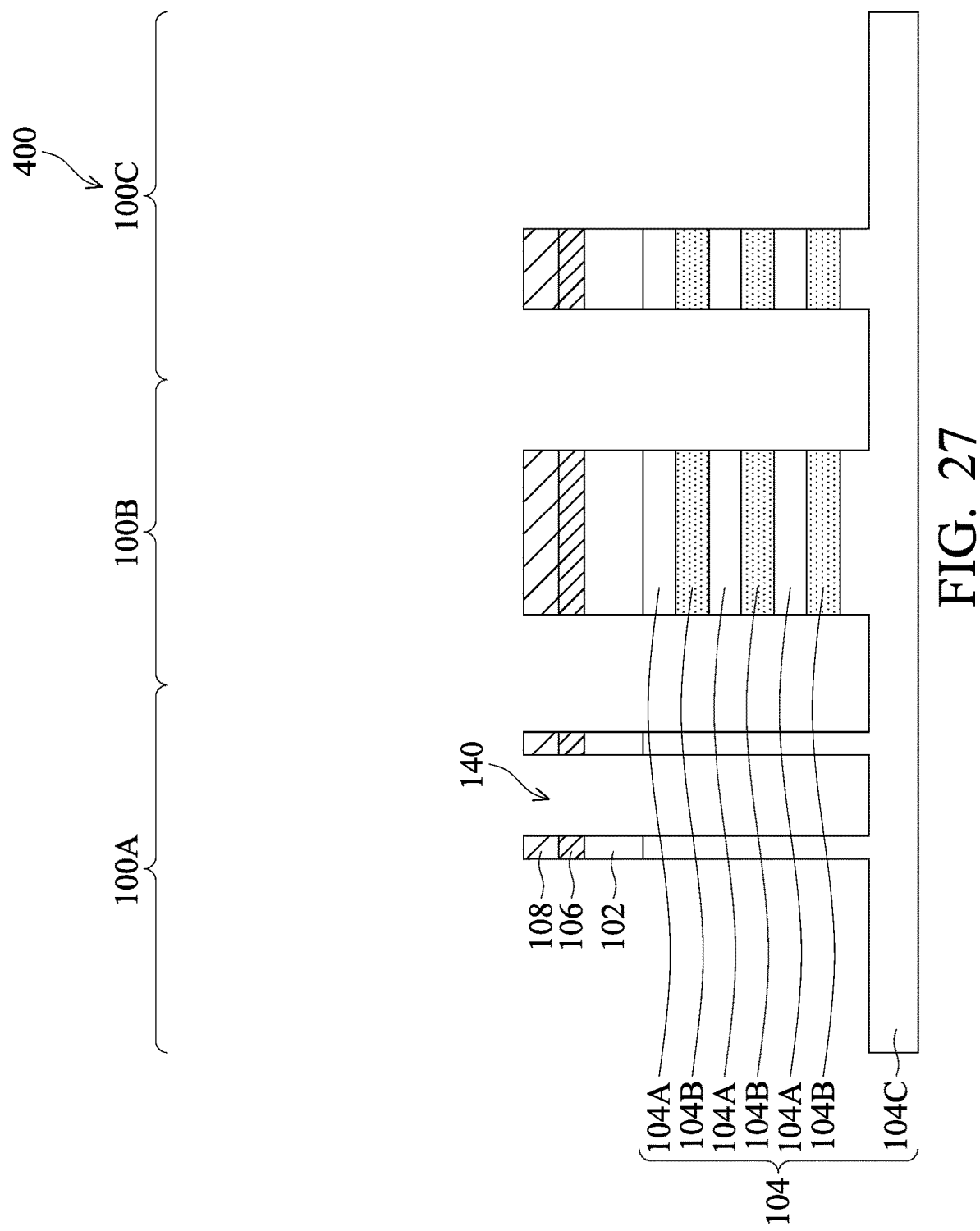

The target layer 104 may include a multilayer structure in any of the regions 100A, 100B, or 100C. For example, FIGS. 26 and 27 illustrate a device 400 where the target layer 104 includes a multilayer structure (e.g., semiconductor layers 104A/104B) embedded in a semiconductor substrate 104C. The multilayer structure may be disposed in the regions 100B and 100C, and the multilayer structure may not extend into the regions 100A.

FIG. 26 illustrates an initial device 400 similar to the device 300 of FIGS. 24 and 25 where like reference numerals indicate like elements formed using like processes. FIG. 27 illustrates the device 400 after the target layer 104 is patterned to define fins 142 using a similar process as described above with respect to FIGS. 1-19. For example, different combinations of spacers and/or mandrels are used to define fins 142 of different sizes and spacing in different regions 100A, 100B, and 100C of the device 400. A carbon layer or carbon rich layer may be used as a capping layer to protect the spacers in the regions 100A and 100B while the spacers are selectively removed from the region 100C. The fins 142 may have a monolithic composition in the regions 100A and 100C while the fins 142 have a multilayer structure (e.g., comprising the semiconductor layers 104A and 104B) in the region 100B. Additional process steps as described above may be applied to device 400 to form nanostructure transistor devices in the regions 100B and 100C and finFET transistors in the region 100A.

Various embodiments provide a double patterning methods where spacers are formed on sidewalls of mandrels. The mandrels and spacers may be selectively removed from different regions over a target layer depending on a desired resulting feature size in different areas of the target layer. To achieve the selective removal, one or more masks may be deposited over the mandrels and spacers. In various embodiments, a carbon-rich layer may be deposited over the spacers (e.g., between different masks) to reduce etching damage (e.g., spacer material loss) as a result of the selective removal of the mandrels and/or the spacers. According, mandrels and spacers of the correct dimensions can be patterned, and critical dimension control while patterning the target layer can be improved.

In some embodiments, a method includes depositing a first mask over a first region of a target layer and a second region of the target layer; forming a plurality of mandrels over the first mask; forming a plurality of spacers on sidewalls of the plurality of mandrels; depositing a second mask over the plurality of mandrels and the plurality of spacers; forming a capping layer over the second mask, wherein the capping layer comprises carbon; and patterning the second mask and the capping layer to expose a first mandrel of the plurality of mandrels and first spacers of the plurality of spacers, the first mandrel and the first spacer overlapping the first region of the target layer. In some embodiments, the method further includes removing the first spacers; after removing the first spacers, removing remaining portions of the capping layer and remaining portions of the second mask; after removing the remaining portions of the capping layer and the remaining portions of the second mask, patterning the first mask, wherein patterning the first mask comprises transferring a pattern of the first mandrel to the first mask; and transferring a pattern of the first mask to the target layer. In some embodiments, patterning the first mask comprises transferring a pattern of second spacers to the first mask, wherein the second spacers are comprised by the plurality of spacers, and wherein the second spacers overlap the second region of the target layer. In some embodiments, patterning the first mask comprises transferring a pattern of a second mandrel to the first mask, wherein the second mandrel is disposed between the second spacers. In some embodiments, the capping layer has a carbon concentration of at least 30%. In some embodiments, forming the capping layer comprises forming the capping layer in a same process chamber as the depositing the second mask.

In some embodiments, wherein depositing the second mask comprises flowing a first carbon-comprising precursor and oxygen over the plurality of spacers and the plurality of mandrels, wherein forming the capping layer comprises flowing a second carbon-comprising precursor over the second mask without flowing oxygen. In some embodiments, the second carbon-comprising precursor is a same chemical compound as the first carbon-comprising precursor. In some embodiments, the second carbon-comprising precursor is a different chemical compound than the first carbon-comprising precursor.

In some embodiments, a method includes depositing a first hard mask over a target layer; forming a first mandrel and a second mandrel over the first hard mask; forming first spacers on sidewalls of the first mandrel and second spacers on sidewalls of the second mandrel; depositing an oxide layer over the first mandrel, the second mandrel, the first spacers, and the second spacers; forming a carbon-comprising capping layer over the oxide layer; patterning the carbon-comprising capping layer to expose the oxide layer; patterning the oxide layer to expose the second mandrel and the second spacers while masking the first spacers and the first mandrel with the carbon-comprising capping layer; removing the second spacers; after removing the second spacers, removing remaining portions of the carbon-comprising capping layer and the oxide layer; transferring a pattern of the first spacers, the first mandrel, and the second mandrel to the first hard mask; and patterning the target layer using the first hard mask as a mask. In some embodiments, the method further includes forming a photoresist over the carbon-comprising capping layer; and patterning the photoresist, wherein patterning the photoresist comprises an ashing process, and wherein patterning the carbon-comprising capping layer comprises using the ashing process to remove a portion of the carbon-comprising capping layer that overlaps the second spacers and the second mandrel. In some embodiments, patterning the oxide layer comprises a diluted hydrogen fluoride (dHF) wet etch process. In some embodiments, the carbon-comprising capping layer has a carbon concentration of at least 30%. In some embodiments, forming the carbon-comprising capping layer comprises forming the carbon-comprising capping layer in a same atomic layer deposition (ALD) chamber as depositing the oxide layer. In some embodiments, the carbon-comprising capping layer has a thickness in a range of 5 Å to 15 Å. In some embodiments, depositing the oxide layer comprises flowing a first carbon-comprising precursor, wherein forming the carbon-comprising capping layer comprises flowing a second carbon-comprising precursor, and wherein the first carbon-comprising precursor and the second carbon-comprising precursor are the same. In some embodiments, depositing the oxide layer comprises flowing a first carbon-comprising precursor, wherein forming the carbon-comprising capping layer comprises flowing a second carbon-comprising precursor, and wherein the second carbon-comprising precursor has a higher carbon to nitrogen ratio than the first carbon-comprising precursor.

In some embodiments, a method includes depositing a first mask over a target layer; forming a first mandrel and a second mandrel over the first mask; forming first spacers on the first mandrel and second spacers on the second mandrel; selectively removing the second spacers while masking the first spacers, wherein masking the first spacers comprising covering the first spacers with a second mask and a capping layer over the second mask, and wherein the capping layer has at least 30% carbon; patterning the first mask, wherein patterning the first mask comprises masking the first mask with the second mandrel, the first mandrel, and the first spacers; and transferring a pattern of the first mask to the target layer. In some embodiments, the target layer comprises a multilayer structure. In some embodiments, the method further includes forming a third mandrel; forming third spacers on the third mandrel; and after selectively removing the second spacers, selectively removing the third mandrel while masking the first mandrel, the first spacers, and the second mandrel, wherein patterning the first mask further comprises masking the first mask with the third spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a first mask over a first region of a target layer and a second region of the target layer;
    forming a plurality of mandrels over the first mask;
    forming a plurality of spacers on sidewalls of the plurality of mandrels;
    depositing a second mask over the plurality of mandrels and the plurality of spacers;
    forming a capping layer over the second mask, wherein the capping layer comprises carbon;
    patterning the second mask and the capping layer to expose a first mandrel of the plurality of mandrels and first spacers of the plurality of spacers, the first mandrel and the first spacers overlapping the first region of the target layer; and
    selectively removing the first spacers without removing the first mandrel while remaining portions of the capping layer and remaining portions of the second mask cover the second region of the target layer.

2. The method of claim 1, wherein the capping layer has a carbon concentration of at least 30%.

3. The method of claim 1 further comprising:
    after removing the first spacers, removing the remaining portions of the capping layer and the remaining portions of the second mask;
    after removing the remaining portions of the capping layer and the remaining portions of the second mask, patterning the first mask, wherein patterning the first mask comprises transferring a pattern of the first mandrel to the first mask; and
    transferring a pattern of the first mask to the target layer.

4. The method of claim 3, wherein patterning the first mask comprises transferring a pattern of second spacers to the first mask, wherein the second spacers are comprised by the plurality of spacers, and wherein the second spacers overlap the second region of the target layer.

5. The method of claim 4, wherein patterning the first mask comprises transferring a pattern of a second mandrel to the first mask, wherein the second mandrel is disposed between the second spacers.

6. The method of claim 1, wherein forming the capping layer comprises forming the capping layer in a same process chamber as the depositing the second mask.

7. The method of claim 6, wherein depositing the second mask comprises flowing a first carbon-comprising precursor and oxygen over the plurality of spacers and the plurality of mandrels, wherein forming the capping layer comprises flowing a second carbon-comprising precursor over the second mask without flowing oxygen.

8. The method of claim 7, wherein the second carbon-comprising precursor is a same chemical compound as the first carbon-comprising precursor.

9. The method of claim 7, wherein the second carbon-comprising precursor is a different chemical compound than the first carbon-comprising precursor.

10. A method comprising:
depositing a first hard mask over a target layer;
forming a first mandrel and a second mandrel over the first hard mask;
forming first spacers on sidewalls of the first mandrel and second spacers on sidewalls of the second mandrel;
depositing an oxide layer over the first mandrel, the second mandrel, the first spacers, and the second spacers;
forming a carbon-comprising capping layer over the oxide layer;
patterning the carbon-comprising capping layer to expose the oxide layer;
patterning the oxide layer to expose the second mandrel and the second spacers while masking the first spacers and the first mandrel with the carbon-comprising capping layer;
removing the second spacers;
after removing the second spacers, removing remaining portions of the carbon-comprising capping layer and the oxide layer;
transferring a pattern of the first spacers, the first mandrel, and the second mandrel to the first hard mask; and
patterning the target layer using the first hard mask as a mask.

11. The method of claim 10, further comprising:
forming a photoresist over the carbon-comprising capping layer; and
patterning the photoresist, wherein patterning the photoresist comprises an ashing process, and wherein patterning the carbon-comprising capping layer comprises using the ashing process to remove a portion of the carbon-comprising capping layer that overlaps the second spacers and the second mandrel.

12. The method of claim 10, wherein patterning the oxide layer comprises a diluted hydrogen fluoride (dHF) wet etch process.

13. The method of claim 10, wherein the carbon-comprising capping layer has a carbon concentration of at least 30%.

14. The method of claim 10, wherein forming the carbon-comprising capping layer comprises forming the carbon-comprising capping layer in a same atomic layer deposition (ALD) chamber as depositing the oxide layer.

15. The method of claim 10, wherein the carbon-comprising capping layer has a thickness in a range of 5 Å to 15 Å.

16. The method of claim 10, wherein depositing the oxide layer comprises flowing a first carbon-comprising precursor, wherein forming the carbon-comprising capping layer comprises flowing a second carbon-comprising precursor, and wherein the first carbon-comprising precursor and the second carbon-comprising precursor are the same.

17. The method of claim 10, wherein depositing the oxide layer comprises flowing a first carbon-comprising precursor, wherein forming the carbon-comprising capping layer comprises flowing a second carbon-comprising precursor, and wherein the second carbon-comprising precursor has a higher carbon to nitrogen ratio than the first carbon-comprising precursor.

18. A method comprising:
depositing a first mask over a target layer;
forming a first mandrel and a second mandrel over the first mask;
forming first spacers on the first mandrel and second spacers on the second mandrel;
selectively removing the second spacers while masking the first spacers, wherein masking the first spacers comprises covering the first spacers with a second mask and a capping layer over the second mask, and wherein the capping layer has at least 30% carbon;
patterning the first mask, wherein patterning the first mask comprises masking the first mask with the second mandrel, the first mandrel, and the first spacers; and
transferring a pattern of the first mask to the target layer.

19. The method of claim 18, wherein the target layer comprises a multilayer structure.

20. The method of claim 18 further comprising:
forming a third mandrel;
forming third spacers on the third mandrel; and
after selectively removing the second spacers, selectively removing the third mandrel while masking the first mandrel, the first spacers, and the second mandrel, wherein patterning the first mask further comprises masking the first mask with the third spacers.

* * * * *